(12) United States Patent
Ravi et al.

(10) Patent No.: US 9,767,888 B1
(45) Date of Patent: Sep. 19, 2017

(54) METHODS AND DEVICES FOR HIGH-SENSITIVITY MEMORY INTERFACE RECEIVER

(71) Applicant: Cadence Design Systems, Inc., San Jose, CA (US)

(72) Inventors: Hari Anand Ravi, Bangalore (IN); Thomas Evan Wilson, Laurel, MD (US); Balbeer Singh Rathor, Morena (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/396,046

(22) Filed: Dec. 30, 2016

(51) Int. Cl.
| | |
|---|---|
| *G11C 5/06* | (2006.01) |
| *G11C 11/4094* | (2006.01) |
| *G11C 11/4091* | (2006.01) |
| *G11C 11/4074* | (2006.01) |
| *H03F 3/45* | (2006.01) |
| *H03K 17/687* | (2006.01) |

(52) U.S. Cl.
CPC ...... *G11C 11/4094* (2013.01); *G11C 11/4074* (2013.01); *G11C 11/4091* (2013.01); *H03F 3/45269* (2013.01); *H03K 17/6872* (2013.01)

(58) Field of Classification Search
CPC .................................. G11C 5/06; G11C 5/14
USPC .................................................... 365/63, 226
See application file for complete search history.

(56) References Cited

U.S. PATENT DOCUMENTS

| | | | | |
|---|---|---|---|---|
| 8,487,702 | B2* | 7/2013 | Lin ........................ | H03F 3/082 330/277 |
| 8,989,688 | B2* | 3/2015 | Mikhemar ............... | H04B 1/18 455/127.2 |
| 2004/0082946 | A1* | 4/2004 | Malis ................. | A61B 18/1206 606/34 |
| 2004/0095120 | A1* | 5/2004 | Kernahan ............. | H02M 3/157 323/282 |
| 2005/0095991 | A1* | 5/2005 | Otaka ..................... | G05F 3/205 455/73 |
| 2007/0122163 | A1* | 5/2007 | Dalton ................... | H04B 10/27 398/208 |
| 2008/0031382 | A1* | 2/2008 | Aoki ....................... | H03C 5/00 375/300 |
| 2008/0204146 | A1* | 8/2008 | Bouny .................. | H03F 1/0288 330/295 |
| 2009/0238582 | A1* | 9/2009 | Tsunoda ............ | H01L 31/02027 398/208 |
| 2009/0240970 | A1* | 9/2009 | Lin ........................... | G06F 1/10 713/500 |
| 2009/0315624 | A1* | 12/2009 | Chow ....................... | H03F 1/34 330/291 |

(Continued)

*Primary Examiner* — Michael Tran
(74) *Attorney, Agent, or Firm* — Schwegman Lundberg & Woessner, P.A.

(57) ABSTRACT

Embodiments relate to systems, methods and computer-readable media to enable design and creation of receiver circuitry. One embodiment is a receiver apparatus comprising a first resistor connected to a first receiver input, four N-type metal oxide semiconductor (NMOS) field effect transistors (FETs), two PMOS FETS, and a trans-impedance amplifier wherein an input terminal of the trans-impedance amplifier is connected to a drain terminal of the second NMOS FET. Additional embodiments including other circuitry, associated methods, and media comprising instructions associated with generation of circuit design files are also described.

20 Claims, 14 Drawing Sheets

(56) References Cited

U.S. PATENT DOCUMENTS

| | | | |
|---|---|---|---|
| 2010/0283712 A1* | 11/2010 | Yen | G09G 3/20 345/55 |
| 2011/0050285 A1* | 3/2011 | Su | G01R 19/04 327/58 |
| 2013/0068935 A1* | 3/2013 | Sakura | G01J 1/44 250/214 A |
| 2013/0099818 A1* | 4/2013 | Grunzke | H03K 19/018571 326/30 |
| 2013/0194024 A1* | 8/2013 | Higashide | H03K 17/162 327/389 |
| 2013/0293185 A1* | 11/2013 | Sutton | H02J 7/0052 320/107 |
| 2015/0195046 A1* | 7/2015 | Yun | H04B 10/69 398/208 |
| 2015/0277470 A1* | 10/2015 | Yamahana | G05F 3/262 398/38 |
| 2015/0303983 A1* | 10/2015 | Lee | H04B 1/525 455/83 |
| 2016/0087587 A1* | 3/2016 | Wang | H03F 1/56 330/295 |
| 2017/0098966 A1* | 4/2017 | Walley | H02J 50/12 |
| 2017/0103704 A1* | 4/2017 | Kimura | G09G 3/3233 |

* cited by examiner

METHODS AND DEVICES FOR HIGH-SENSITIVITY MEMORY INTERFACE RECEIVER

TECHNICAL FIELD

Embodiments described herein relate to electronic circuits and design automation (EDA), and to associated systems, methods, devices, and instructions for generation of circuit design files. Some embodiments pertain to microprocessor interface circuits with memory devices (e.g., double data rate (DDR) synchronous dynamic random access memory (SDRAM) such as DDR2, DDR3, DDR4, and low power double data rate (LPDDR) SDRAM used in portable electronic devices). Some embodiments particularly relate to memory interface receivers.

BACKGROUND

A typical computing machine is implemented with a microprocessor, memory, and a number of other modules depending on the function to be performed by the computing machine. DDR random access memory (RAM) is a particular type of RAM commonly used in current technology that performs two read accesses or two write accesses per clock cycle. Both microprocessors and DDR RAM operate on various different power supply voltages. Interface circuits that can convert between different signal levels and different drive levels are used to allow for compatible communications between microprocessors and memory devices.

EDA is a category of systems for assisting with the design of electronic systems and devices. Large, integrated circuit designs are often assembled from previously designed blocks. This enables reduced turnaround times for generation of an integrated circuit. Schematic and layout information for such block portions of a design may be exchanged or licensed as intellectual property.

BRIEF DESCRIPTION OF THE DRAWINGS

The present invention is illustrated by way of example and not limitation in the figures of the accompanying drawings, in which like references indicate similar elements.

DETAILED DESCRIPTION

Embodiments described herein relate to microprocessor interface circuits with memory devices, particularly memory devices such as DDR SDRAM such as DDR2, DDR3, DDR4, and low power double data rate (LPDDR) SDRAM (e.g. LPDDR 3/4 and such for power sensitive and portable electronic devices). Some embodiments particularly relate to driving these memory devices from microprocessors with a low core voltage. The following description and the drawings illustrate specific embodiments to enable those skilled in the art to practice them. Other embodiments can incorporate structural, logical, electrical, process, and other changes. Portions and features of some embodiments can be included in, or substituted for, those of other embodiments, and are intended to cover all available equivalents of the elements described.

Some embodiments described herein relate to circuits designed in complementary metal oxide semiconductor field effect transistors (CMOS). These transistors are used in some digital integrated circuits for their simplicity, low cost, high density, and low power dissipation. Specifically, CMOS transistors only dissipate power while dynamically switching and exhibit no static power dissipation. The CMOS transistors are either of an N-type or a P-type, which refers to the doping content of the channel of the transistor. For example, an N-channel CMOS transistor produces an N-channel when the gate voltage exceeds a threshold. The N-type or N-channel transistors will be referred to as N-channel metal oxide semiconductor (NMOS) field effect transistors (FET) and the P-type or P-channel transistors will be referred to as P-channel metal oxide semiconductor (PMOS) FETs. Common voltages used to describe these transistors are the gate to source voltage ($V_{gs}$), drain to source voltage ($V_{ds}$) and threshold voltage ($V_t$). The current through the transistors is the drain to source current ($I_{ds}$). For NMOS transistors, all these values, in some embodiments, are positive; for PMOS transistors, in some embodiments, all these values are negative. In various embodiments described herein, the PMOS voltages and current will be described in terms of absolute values. Specifically, when referring to PMOS transistors, the gate to source voltage will mean $|V_{gs}|$, the drain to source voltage will mean $|V_{ds}|$, the threshold voltage will mean $|V_t|$, and the drain current will mean $|I_{ds}|$. Anywhere herein where particular values are used, including specific values (e.g., 0 volts, 0.7 volts, etc.), it is to be understood that this is referring to a target value that operates within a variation tolerance around or approximate to the described value, where the variation is within tolerances set by the specific implementation (e.g., +/−0.05 volts, etc.).

Figure 1:
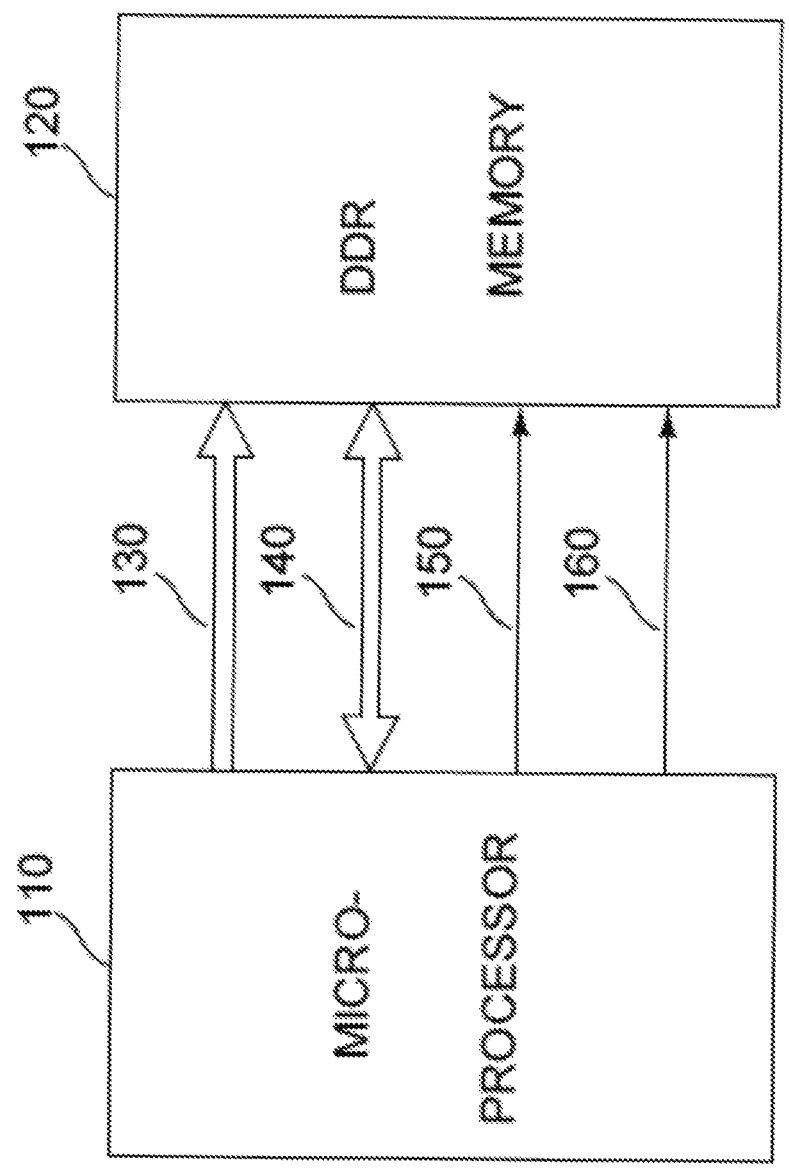
FIG. 1 illustrates the interface between a microprocessor and a memory module, in accordance with some embodiments described herein.

FIG. 1 illustrates the interface between microprocessor 110 and a memory module 120, in accordance with some embodiments described herein. The memory module 120 is a dynamic random access memory (DRAM) that is connected to the microprocessor 110 by an address bus 130, a data bus 140, a control signals read-write (R/W) 150, and chip-enable (CE) 160. The system shown in FIG. 1 is a generic, simple implementation of a microprocessor system that would be modified in various ways depending on the application. The memory module 120 is a DDR SDRAM.

Non-volatile memory is memory that retains the stored information even when powered off. Examples of non-volatile memory are hard disks, memory tapes, and flash RAM. Volatile RAM is memory that loses the information when power is disconnected. Examples of volatile ram are static RAM (SRAM) and dynamic RAM (DRAM). SRAM uses more transistors in a feedback latch up configuration, which does not include refreshing operations. DRAM may be implemented with a small capacitor, which will slowly leak charge and consequently needs to be periodically refreshed. SRAM is faster and more expensive and used sparingly in devices such as a high-speed cache. DRAM is one method for the bulk volatile memory access. DRAM may be controlled on a system clock and therefore referred to as SDRAM.

Single data rate (SDR) SDRAM was originally built to execute one memory read access or one write access per clock cycle. On each clock cycle, an n-bit word may be transferred to or from the memory. The word length is, in some embodiments, configured in multiples of eight, and in more recent computer machines, it is common to transfer 64-bit words per clock cycle. DDR SDRAM was implemented as an improvement over SDR SDRAM and is capable of performing two read accesses or two write accesses per clock cycle. This was accomplished by performing one access on the rising edge of the clock and one access on the falling edge of the clock. In this manner, the data transfer rate is doubled by transferring two 64-bit words per clock cycle.

The operation of the microprocessor 110 involves the execution of programs that are loaded into the memory module 120 so as to create, edit, and delete data that is also stored in the memory module 120 or other devices. Specifically, each microprocessor operation involves a fetch and execute cycle where an instruction is read from the memory module 120, decoded by the microprocessor 110, and executed. Also, the execution of the instruction often involves a data read or a data write to the memory module 120. Each of these instruction cycles is performed synchronously to a system clock, with the duration of the instruction cycle lasting between one and three clock cycles.

The memory access interface traditionally involves bi-directional data bus 140 with a bus width of n-bits to provide the transfer to and from the memory module 120 in the form of n-bit words. The location in the memory module 120 which the data word is being written to or read from is indicated by the address bus 130. The memory module 120 is selected by the CE 160 signal, which allows the data bus 140 to be used by other devices not shown in FIG. 1. The R/W 150 signal indicates to the memory module 120 whether the data access is a read operation or a write operation. This also determines the directional operation of the data bus 140. A clock signal is used to synchronize the microprocessor 110 and the memory module 120 during memory access and is not shown in FIG. 1.

During a write operation, the microprocessor 110 indicates the address location on the address bus 130 and places the data on the data bus 140. It also asserts the CE 160 and the R/W 150 signals for a write operation. Then the memory module 120 writes the data on the data bus 140 into the memory at the address location indicated by the address bus 130, and the write operation is complete. During a read operation, the microprocessor 110 indicates the address location on the address bus 130 and floats the data bus 140 (high Z or high impedance state). It also asserts the CE 160 and R/W 150 signals for a read operation. Then the memory module 120 places the data at the memory location indicated by the address bus 130 onto the data bus 140. The microprocessor 110 then reads the data from the data bus 140, and the read operation is complete. All these functions are synchronized to the system clock, which is provided to both the microprocessor 110 and the memory module 120. This is a description of a microprocessor 110 with a very simple implementation. Many implementations are significantly more complicated, involving memory caches, direct memory access transfers, and a plethora of other devices connected to the microprocessor system bus.

The frequency with which the microprocessors 110 access memory module 120 impacts performance. Since every instruction cycle involves at least one memory access, the speed of a computer machine is greatly limited by the memory access speed. Therefore, improving the method and speed of the memory access plays a continuing role in the evolution of computer machines. There are several related factors. The interface circuits that are controlling the bus are configured to have sufficient drive capability to quickly switch under the loading conditions as presented by the bus lines and the chips connected to them. The signals propagate fast enough along the bus lines that transmission effects become significant. Therefore, the bus lines, along with the source and load impedances, are controlled so as to reduce reflections. Additionally, the memory module 120 and the microprocessor 110 may operate at different power supply voltages. Therefore, memory access may involve the use of a level translator.

Memory types such as DDR3. DDR4, LPDDR3, and LPDDR4 typically operate between a VDDQ=1.6 Volt supply voltage down to a VDDQ=1.0 Volt supply voltage, while current microprocessor cores operate with a power supply voltage as low as VDD=0.65 Volts. Therefore, translator interface circuits are needed that can drive a memory module 120 operating on a higher supply voltage from a microprocessor 110 with a lower core voltage. The microprocessor supply voltage, core supply voltage, or signal supply voltage will be referred to as VDD while the memory supply voltage or I/O supply voltage will be referred to as VDDQ.

Integrated circuit (IC) technologies offer different types of transistor devices depending on their intended application. Specifically, there are signal devices and I/O devices. The microprocessor 110 uses signal devices operating on the lower microprocessor core supply voltage for computation and program execution. The microprocessor 110 uses I/O devices that can withstand larger voltage levels and higher power levels to interface with external circuits and chips. The signal devices, such as signal metal oxide semiconductor field effect transistors (MOSFETs), are built for low power consumption and switching speed. A MOSFET transistor is typically built with a metal or polysilicon gate material constructed over the channel of the transistor. When the voltage applied to the gate terminal exceeds a certain threshold (e.g., threshold voltage $V_t$), a conductive channel forms beneath the gate allowing current to flow from the source to the drain. A thin oxide layer separates and insulates the gate from the channel. The oxide layer is deliberately designed to be very thin to improve transistor characteristics such as the unity gain frequency and threshold voltage. If the gate-to-drain or gate-to-source voltage across the oxide layer exceeds a certain level, the transistor will be damaged. The larger I/O transistors are built with a greater power handling capability and with a thicker oxide layer. This allows the L/O transistor to operate with I/O voltage levels without causing damage to the transistor. In some embodiments, such signal transistors consume less power, occupy less chip area, and switch faster.

Figure 2:
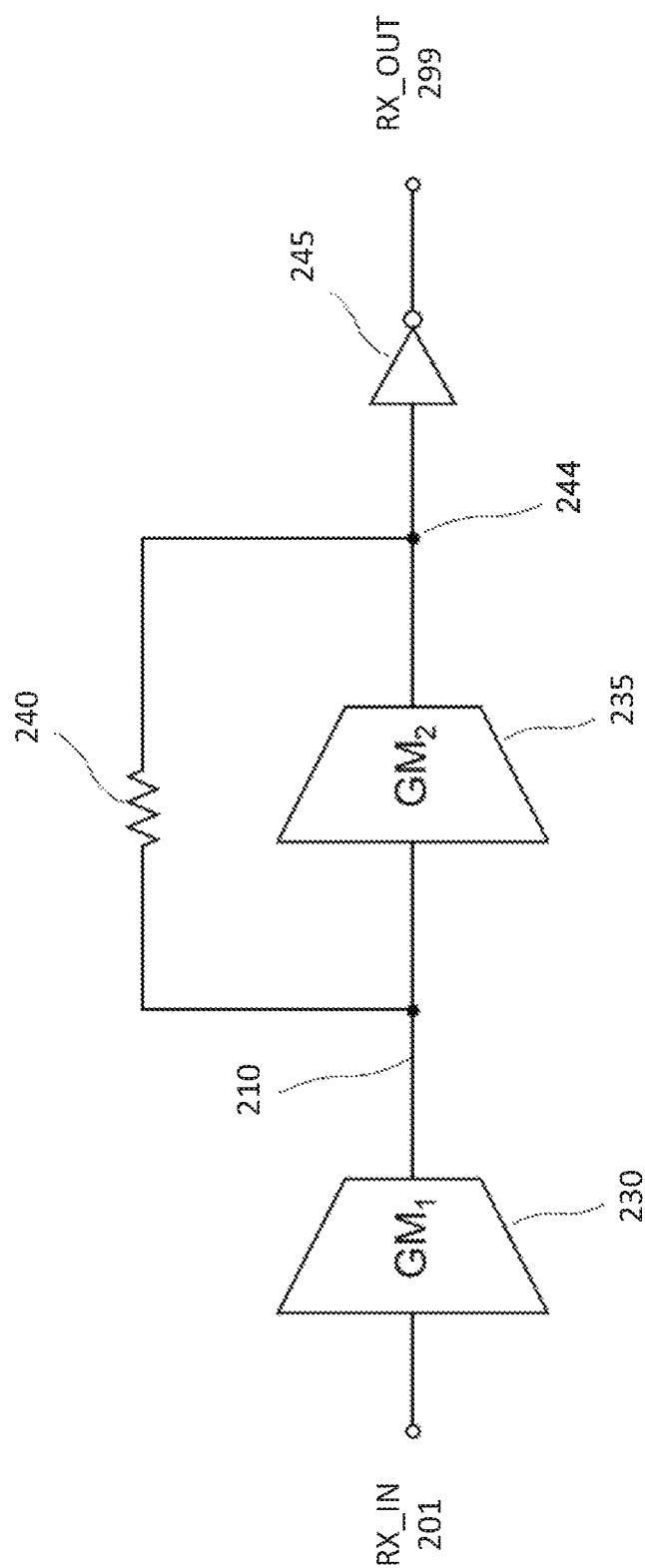
FIG. 2 illustrates a receiver interface implemented with a trans-conductance amplifier and a trans-impedance amplifier, in accordance with some embodiments.

FIG. 2 illustrates a receiver interface implemented with a trans-conductance amplifier 230 and a trans-impedance amplifier, in accordance with some embodiments. The received input signal (RX_IN) 201 is converted to an output current by the trans-conductance amplifier 230. The trans-impedance amplifier, comprising the trans-conductor 235 and the resistor 240, converts the output current back into an output voltage that is compatible with the microprocessor core voltage levels. The output of the trans-impedance amplifier is conditioned (a "squaring up" process) by inverter 245 and takes the signal from node 244 to provide the received signal output (RX_OUT) 299. An example of such signals and conditioning according to a simulation of an embodiment described herein is illustrated below with respect to FIG. 9. In some embodiments, the trans-conductance amplifier 230 is implemented with passive components that are insensitive to the larger voltage levels from which the DDR memory may operate, and since the output of the trans-conductance amplifier 230 is a current that is proportional to the voltage input, the output current carries the data information. Therefore, the output voltage at node 210 of the trans-conductance amplifier 230 can be held relatively constant (and below the core supply voltage) so as to avoid damaging any signal devices. The trans-impedance amplifier uses negative feedback via resistor 240 from the trans-conductor 235 (e.g., where $GM_2$ is negative).

Figure 3A:
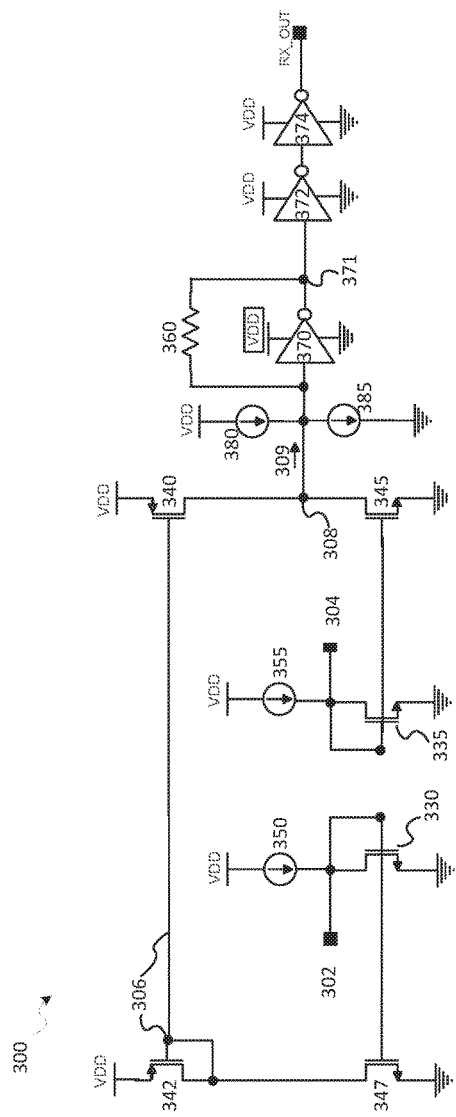
FIG. 3A illustrates aspects of an example circuit implementation of a receiver, in accordance with some embodiments.
Figure 3B:
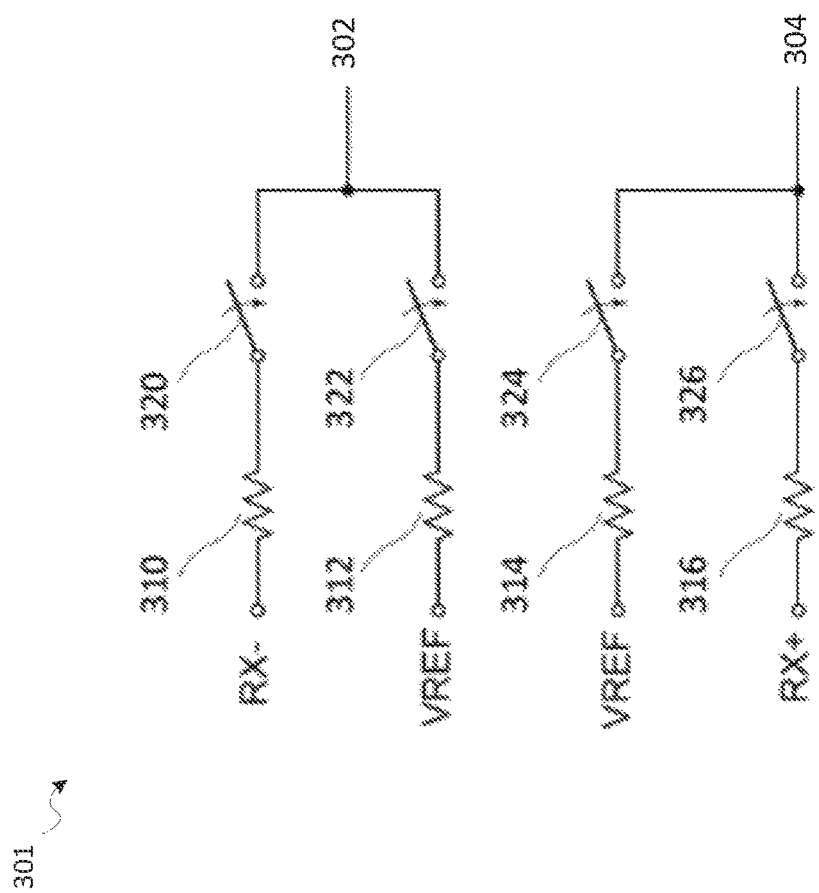
FIG. 3B illustrates aspects of an example circuit implementation of a receiver, in accordance with some embodiments.

FIGS. 3A and 3B illustrate an example circuit implementation of a receiver, in accordance with some embodiments. The receiver of FIGS. 3A and 3B may be an example of the trans-conductance amplifier 230 followed by the trans-impedance amplifier as described in FIG. 2, in accordance with some embodiments. FIG. 3A shows circuit 300. FIG. 3B shows a switching circuit 301 with resistors that can be coupled to circuit 300 to alternate between calibration modes and operating modes. The trans-conductance amplifier of FIGS. 3A and 3B is implemented with resistors 310, 312, 314 and 316, switches 320, 322, 324, and 326 (shown in FIG. 3B); current sources 350 and 355, PMOS FETs 342 and 340, and NMOS FETs 330, 335, 345, and 347 (shown in FIG. 3A). The trans-impedance amplifier is implemented with circuit 370 and the resistor 360. Output squaring is performed using circuits 372 and 374 on the output of the trans-impedance amplifier to generate RX_OUT. In other embodiments, other implementations of such amplifiers are used.

Figure 3C:
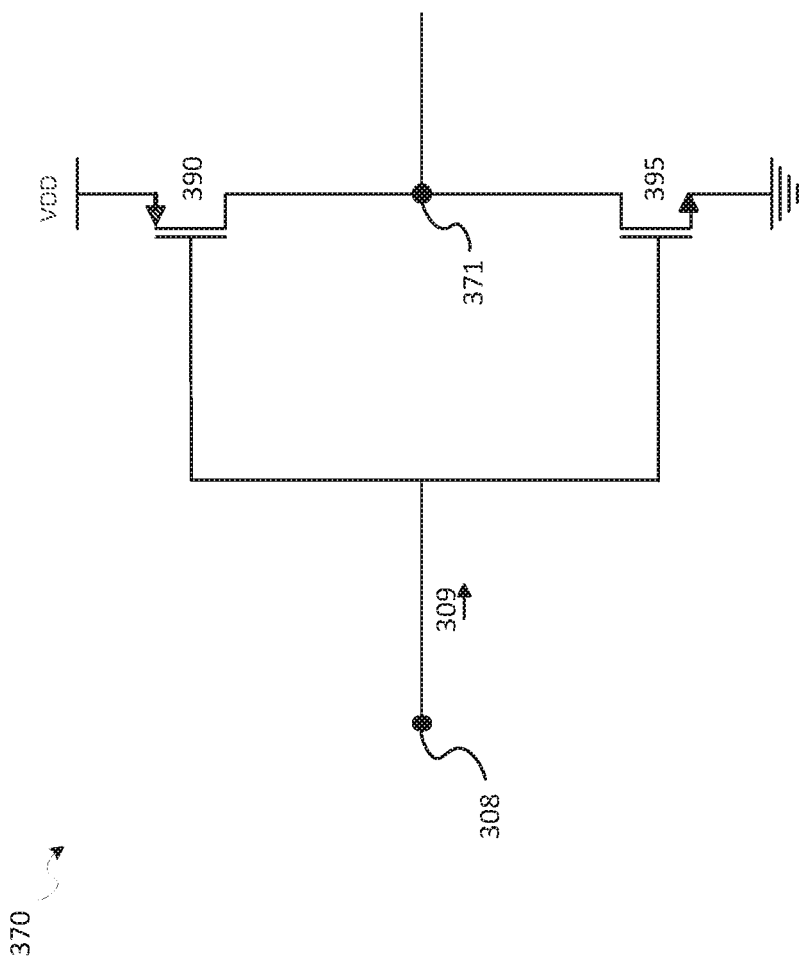
FIG. 3C illustrates aspects of an example circuit implementation of a receiver, in accordance with some embodiments.

The circuit of FIGS. 3A-C can receive a single ended or differential input from a DDR memory device using the RX+ and RX− input terminals. The VREF input terminals provide a common mode voltage level from the DDR receiver. Each of the inputs can be connected or disconnected through a switch depending on the mode the circuit is operating in. In one example embodiment, the operating modes are:

Single-ended data receiving—Switches 320 and 326 are closed while switches 322 and 324 are open wherein the second input of the receiver RX− is connected to reference voltage VREF Differential data receiving—Switches 320 and 326 are closed while switches 322 and 324 are open.

First calibration mode where switches 322 and 324 are closed and switches 320 and 326 are open.

Resistors 310, 312, 314, and 316 are all of the same value and capable of withstanding the voltage drive levels from the DDR memory chip. Switches 320, 322, 324, and 326 are implemented with I/O devices such as transmission gates built with an I/O PMOS FET and an I/O NMOS FET. The current sources 350 and 355 are set during a calibration phase described below. The NMOS FET 335 is diode connected to copy its drain current to NMOS FET 345. The variation in drain current of NMOS FET 345 is sensed by the trans-impedance amplifier through resistor 360 and converted to an output voltage. The output voltage is conditioned through inverter circuits 372 and 374 to provide received data output RX_OUT at core supply levels.

During a single-ended data receiving operation for a simple implementation (e.g., a previous circuit represented in FIGS. 4-7 by simulation data 420, 520, 620, and 720 of the circuit of FIG. 2 where FETs 342, 347, 340, and 345 are not present, the gates of FETs 330 and 335 are connected, the gate and drain of FET 335 are not connected, and node 304 is directly coupled to node 308), the DDR memory signal is received on RX+ with switch 326 closed. When RX+ switches high or low, the current through resistor 316 is increased or decreased. This current is shunted to ground through the diode-connected NMOS FET 330 along with the current from the current source 350. The variation in current produces a one-to-one variation in the gate-to-source voltage of NMOS FET 330. The gate-to-source voltage of NMOS FET 335 is identical to that of NMOS FET 330. Thus, neglecting the difference in drain-to-source voltage, NMOS FET 330 and NMOS FET 335 will have the same drain current. Therefore, the drain current of NMOS FET 335 will reflect any voltage variation from the RX+ input signal. The current drive into the trans-impedance amplifier (e.g., into the node between current sources 380 and 385 from the node 308 between FETs 340 and 345 and toward resistor 360) is equal to the current being sourced by VREF through resistor 312 along with the current source 355 minus the drain-to-source current sinking through NMOS FET 335. To the extent that the drain voltage of NMOS FET 335 is held constant, the variation in $I_{ds}$ is transferred to the trans-impedance amplifier in $I_x$ 309. The trans-impedance amplifier converts the current $I_x$ 309 into a proportional output voltage via resistor 360. At higher data rates, the input swing to the receiver gets smaller, so the receiver correspondingly needs to be configured to send smaller signals. For the previous circuit mentioned above, if the receiver input swing is sufficiently small, the output inverter will not receive enough over-drive to run the system at rates up to 4266 megabits per second (Mbps). Simple modification to the resistance values or driving current to adjust the gain of the system reduces the bandwidth or increases power consumption beyond acceptable levels. By contrast, circuit 300 enables operation at rates above 4266 Mbps with acceptable power consumption with appropriate FET selection.

Circuit 301 (shown in FIG. 3B) uses switches 320, 322, 324, and 326 to shift between an operating mode and a calibration mode. In the differential or single ended operating mode, switches 322 and 324 are open, while switches 320 and 326 are closed. The output voltage $V_{OUT}$ at node

371 (FIGS. 3A and 3C) can be determined as a function of the input voltage $V_{INP}$ from the RX+ terminal and voltage $V_{INN}$ from the RX− terminal. In case of single ended operating mode. RX− terminal is connected to reference voltage VREF.

For $V_{INN}$, if the voltage at node 302 (e.g., the node directly connected to the drain and gate of NMOS FET 330) has a value of $V_X$, then $V_X$ can be approximately determined based on a transconductance value $g_{m1}$ of NMOS FET 330, a resistance value $R_2$ of resistor 310, and the voltage $V_{INN}$ at the receive terminal RX− of circuit 301 according to:

$$V_X \approx \frac{V_{INN}}{g_{m1}R_2} \quad (1)$$

Further, with transconductance values of NMOS FET 347 and PMOS FET 342 also equal to $g_{m1}$, the voltage $V_p$ at node 306 is approximately:

$$V_P = -\frac{V_X g_{m1}}{g_{m1}} \quad (2)$$

With a transconductance value $g_{m2}$ for NMOS FET 345 and PMOS FET 340, and $g_{mi}$ for circuit 370, the voltage $V_A$ at node 308 is approximately:

$$V_A = -\frac{V_p g_{m2}}{g_{mi}} \quad (3)$$

The approximate output voltage $V_{OUT}$ at the 371 node is then given by:

$$V_A - R_F g_{mi} V_A = V_{OUT} \quad (4)$$

where $R_F$ is the resistance value of resistor 360, and $$V_{OUT} \approx -\frac{R_F}{R_2} V_{INN} \frac{g_{m2}}{g_{m1}} \quad (5)$$

Similarly for $V_{INP}$, the contribution to the output voltage $V_{OUT}$ can be determined as:

$$V_{OUT} \approx \frac{R_F}{R_1} V_{INP} \frac{g_{m2}}{g_{m1}} \quad (6)$$

where $R_1$ is the resistance value of the resistor 316.

Based on this, the output voltage $V_{OUT}$ at node 371 for both $V_{INN}$ and $V_{INP}$ inputs is approximately:

$$V_{OUT} \approx \left(\frac{R_F}{R_1}\frac{g_{m2}}{g_{m1}}V_{INP} - \frac{R_F}{R_2}\frac{g_{m2}}{g_{m1}}V_{INN}\right) \quad (7)$$

The current sources 350, 355, 380, and 385 are set during calibration procedures with common mode voltages, VREF. The calibration procedures are performed with switches 322 and 324 closed and switches 320 and 326 open. VREF is the voltage halfway between the high input signal level and the low input signal level. Therefore, the decision threshold of the DDR memory receiver is set at the input level of VREF.

Two calibration procedures are undertaken to allow the DDR memory receiver to operate with different DDR devices operating with different signal levels. In the first calibration procedure, the current sources 350 and 355 are adjusted to a preset desired current matched to corresponding NMOS FETs 330 and 335. In various embodiments, this calibration sets the bias currents through current sources 350 and 355 to set a target voltage at the drain of the corresponding FET. The purpose of the current sources 350 and 355 is to ensure that NMOS FETs 330 and 335 stay on even when the receive input terminals RX+ and RX− are at extreme values in order to provide full signal swing. The second calibration operation with current sources 380 and 385 is described below with respect to FIG. 3C.

FIG. 3C then shows an example of circuit 370, including PMOS FET 390 and NMOS FET 395. In other embodiments, other implementations of circuit 370 may be used. For current 309 with a value of $1_x$, consider the case where $1_x=0$. Then the voltage drop across resistor 360 (shown in FIG. 3A) is zero and the voltage $V_{OUT}$ at node 371 is equal to the voltage $V_A$ at node 308 (with resistor 360 coupled across these nodes as shown in FIG. 3A). The transistor dimensions and carrier mobility can be controlled so as to bias the output voltage $V_{OUT}$ at an equilibrium point approximately halfway between VDD and ground such that the sum of their gate-to-source voltages is equal to VDD. This is a stable negative feedback configuration. For instance, suppose some noise pushes the gate voltage at node 308 slightly more positive. Then, the PMOS FET 390 will source less current and NMOS FET 395 will sink more current. This in turn will pull $V_{OUT}$ down, pulling the voltage at node 308 and opposing the initial increase in voltage at node 308 (e.g., negative feedback). Thus, the trans-impedance amplifier works to maintain the quiescent feedback voltage at node 308. Since in some embodiments the core supply voltage VDD can be as low as 0.65 Volts, the NMOS FET 395 and PMOS FET 390 are implemented with low threshold devices. This way, both transistors will be on even when their gate-to-source voltages are only 0.35 Volts. While specific example voltages are discussed herein, other voltages are used in other embodiments, and any discussed voltages are within an associated operational tolerance based on the specific implementation.

The quiescent operating point of the trans-impedance amplifier is determined during calibration with current sources 380 and 385 (shown in FIG. 3A). The current sources 380 and 385 are configured during the second calibration such that with both VREF inputs engaged, the input trans-impedance current 309 with a value $1_x$ produces an output voltage $V_{OUT}$ right at the input switching threshold of the CMOS inverter circuit 372. Since VREF is halfway between the high input signal and the low input, this sets the decision threshold at the input of the receiver to match the switching threshold of the CMOS inverter circuit 372. This calibration procedure is what determines the quiescent operating point for $1_x$ and the voltage at node 308. The second calibration is performed, in some embodiments, by starting with the both VREF inputs engaged, and current source 385 at a maximum setting (e.g., a maximum first offset calibration current). The current through current source 385 is then decreased until the signal at the data output terminal RX_OUT changes (e.g., from high to low). The value of the current through current source 385 when this toggle happens is considered the pull-down offset calibration current. If the value at the data output terminal does not toggle before the current flowing through current source 385 reaches the minimum operating current (e.g., 0 amps), then current source 380 starts at the minimum current of current source 380 and increases to a point (e.g., a pull-up offset calibration current setting) where the data output terminal toggles from high to low. The setting of both current sources 385 and 380, when the toggle at the data output terminal occurs, is used as the calibrated operating point.

Thus, according to some embodiments, the two current sources 380 and 385 are used to tune the receiver to its switching point with an offset calibration. With switches 320 and 326 open and switches 322 and 324 closed, two current sources 380 and 385 are used, one to pull down node 308 and the other to pull-up node 308. The first offset current of current source 385 is gradually decreased from its maximum value to 0 microamperes (uA) until RX_OUT toggles from 1 to 0. If RX_OUT toggles before the first offset current reaches 0 uA, the first current at the point of the toggle is used as the offset. If RX_OUT does not toggle even when the first offset current is at 0 uA, then the second offset current from current source 380 is gradually increased from 0 uA until the point at which RX_OUT toggles from 1 to 0. If the toggle does not occur before the maximum operation current of the second offset current from current source 380, a failure is identified. Otherwise, the first and/or second offset current at the point of RX_OUT toggling is used as the calibration value. In some embodiments, pull-up and pull-down resistors are used in place of current sources to perform such an offset calibration.

A small signal analysis can further describe the voltage and current variation of the trans-impedance amplifier circuit 370 of FIG. 3C. Define $i_x$, $v_o$, and $v_{fb}$ as small signals varying around the quiescent operating point. Since both transistors have the same gate voltage, the total trans-conductance of the inverter pair is:

$$G_m = gm_p + gm_N \qquad (8)$$

where $gm_p$ and $gm_N$ are the respective transconductance values for PMOS FET 390 and NMOS FET 395. Note this is the trans-conductance where the output current of the trans-conductance amplifier is referenced as sinking current (into the trans-conductor). Then $$i_x = G_m v_{fb} \qquad (9)$$

and $$v_O = v_{fb} - i_x R_x = i_x\left(\frac{1}{G_m} - R_x\right) \qquad (10)$$

Here, $G_m R_x > 1$ and so the trans-impedance gain is negative. Also, for reasonably large $G_m$, the feedback voltage $v_{fb}$ variation will be small and the quiescent feedback voltage $V_{fb}$ will be maintained by the negative feedback. Specifically, if $l_x$ increases, the gate voltages (and $V_{fb}$) of NMOS FET 345 and PMOS FET 390 will initially increase. This causes the PMOS FET 390 to source less current and the NMOS FET 395 to sink more current, and the output voltage, $V_o$, will drop. This will draw current through resistor 360, and pull the gate voltages of NMOS FET 395 and PMOS FET 390 down, counteracting the initial increase (e.g., negative feedback). Similar remarks apply for the opposite condition: If $l_x$ decreases, the negative feedback will cause the output voltage $V_o$ to increase. The negative feedback trans-impedance amplifier has only two poles and is inherently stable.

The resistors 310, 312, 314, and 316 along with switches 320, 322, 324 and 326 may be exposed to I/O voltage levels and are implemented with I/O devices. However, the resistors and switches shield the remaining devices in the circuit. None of the transistors (e.g., NMOS FETs 330, 335, 345, 347 PMOS FET 340; 342) are exposed to I/O voltages and can be implemented with signal devices. In some embodiments, current sources 350 and 355 along with the inverter circuits 372 and 374 are also implemented with signal devices. This results in a large performance improvement along with a reduction in power consumption and chip area.

The calibration procedure described above can be used to set the current through NMOS FETs 330 and 335 for full signal swing (such that these NMOS FETs stay on while the input is switching) and a centerline threshold level for any type of DDR memory chip that it (e.g. the circuit of FIGS. 3A-C) is receiving from. For example, in one embodiment, the DDR memory is operating on an approximately 1.1 Volt (V) supply and the input received signal varies from approximately 0 to 366 millivolts (mV). In one such embodiment, a common mode VREF would be 183 mV, and this is set as the memory receiver decision threshold with the calibration procedure described above.

In various systems, receiver functions have been implemented using a MOS differential pair input. For single-ended operation, one side of the differential pair is set to VREF. Due to the wide variation of input signal levels, both an NMOS and a PMOS differential pair are implemented. Depending on the common mode level, either the NMOS differential pair or the PMOS differential pair is actively used for receiving. The output of the differential pair is connected to a folded cascode for level translation and loading. This is then connected to a common mode logic (CML) stage and then through a CML-to-CMOS converter. Both the differential input stages are implemented using I/O devices to withstand the large voltage levels seen at the I/O terminals. This increases power consumption and chip area and reduces performance. Also, during large signal swings, the differential pairs are sometimes driven into a non-linear operating range causing duty cycle distortion.

In some embodiments described herein, the differential amplifier stages and the folded cascade circuits are not used. The CML stage and CML-to-CMOS converter are also eliminated. By eliminating all these circuit blocks, there are large gains in terms of chip area and power consumption. Also, in some embodiments, most of the transistors in the proposed embodiments are signal transistors, which improves the performance in terms of switching speed and bandwidth. This reduces the inter-symbol interference, allows for receiving at higher data rates, and reduces the need for equalization techniques. Such a circuit is not a conventional circuit, and is referred to below as a related memory interface circuit described with data 420, 520, 620, and 720.

FIGS. 4-9 then illustrate aspects of a high-sensitivity memory interface receiver according to various embodiments described herein. FIGS. 4-9 particularly show comparisons of the operation of circuit 300 of FIG. 3A (associated with data 410, 510, 610, and 710) when compared with the related memory interface receiver circuit described above (associated with data 420, 520, 620, and 720). FIGS. 4-9 further illustrate the selection of design values according to some embodiments. While certain values are detailed below, it will be understood that any such values are associated with device variance, which may be a variance of plus or minus five percent, plus or minus ten percent, or any other such operationally acceptable variation in elements of a circuit. Thus, a resistance value of 2 kilo ohms (kOhms) in a design may result in an actual device having a corresponding resistor with an actual value between 1.8 kOhm and 2.2 kOhm or another such range associated with the design constraints of the particular implementation.

Figure 4:
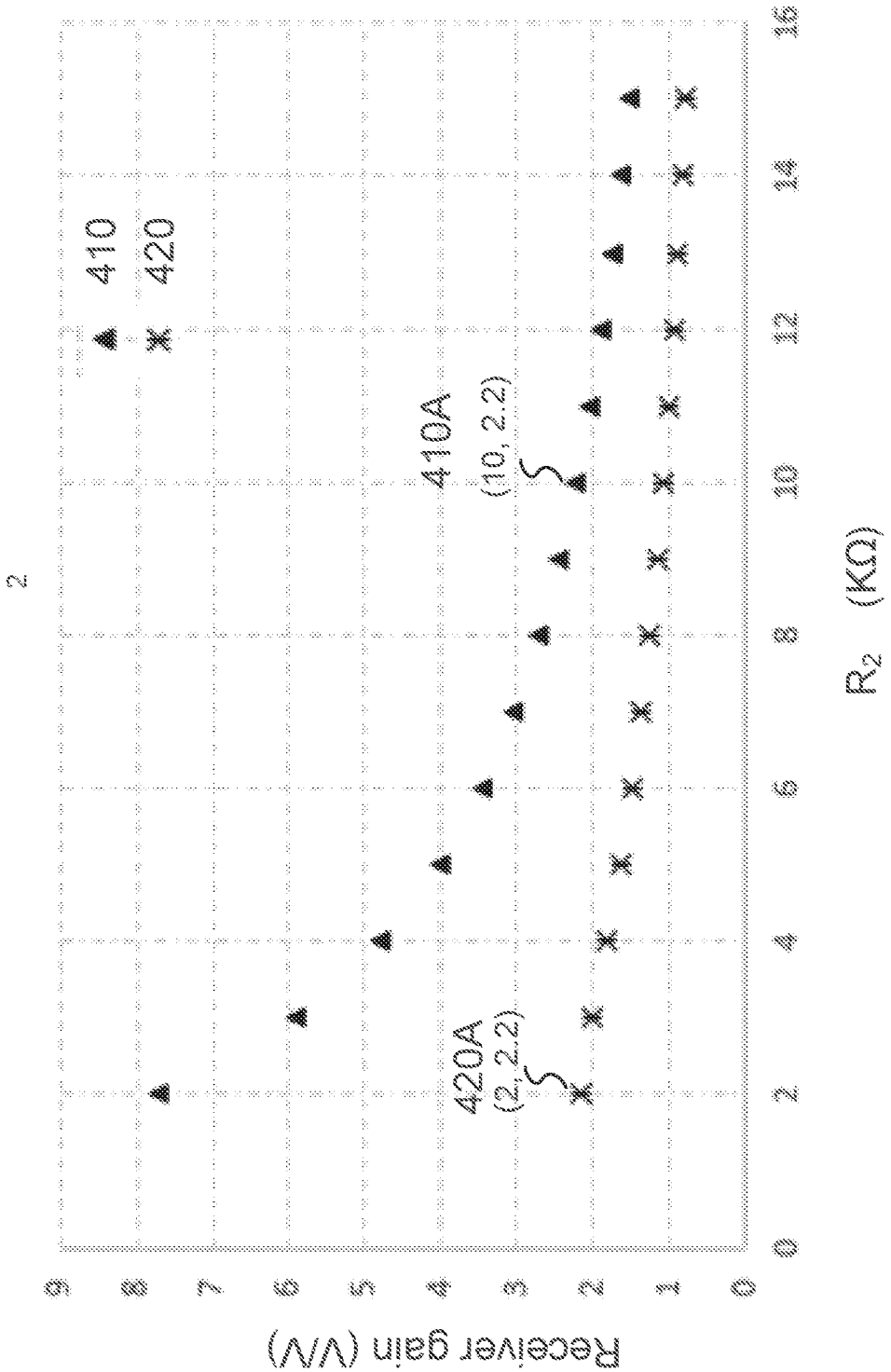
FIG. 4 illustrates aspects of a high-sensitivity memory interface receiver according to various embodiments described herein.
Figure 5:
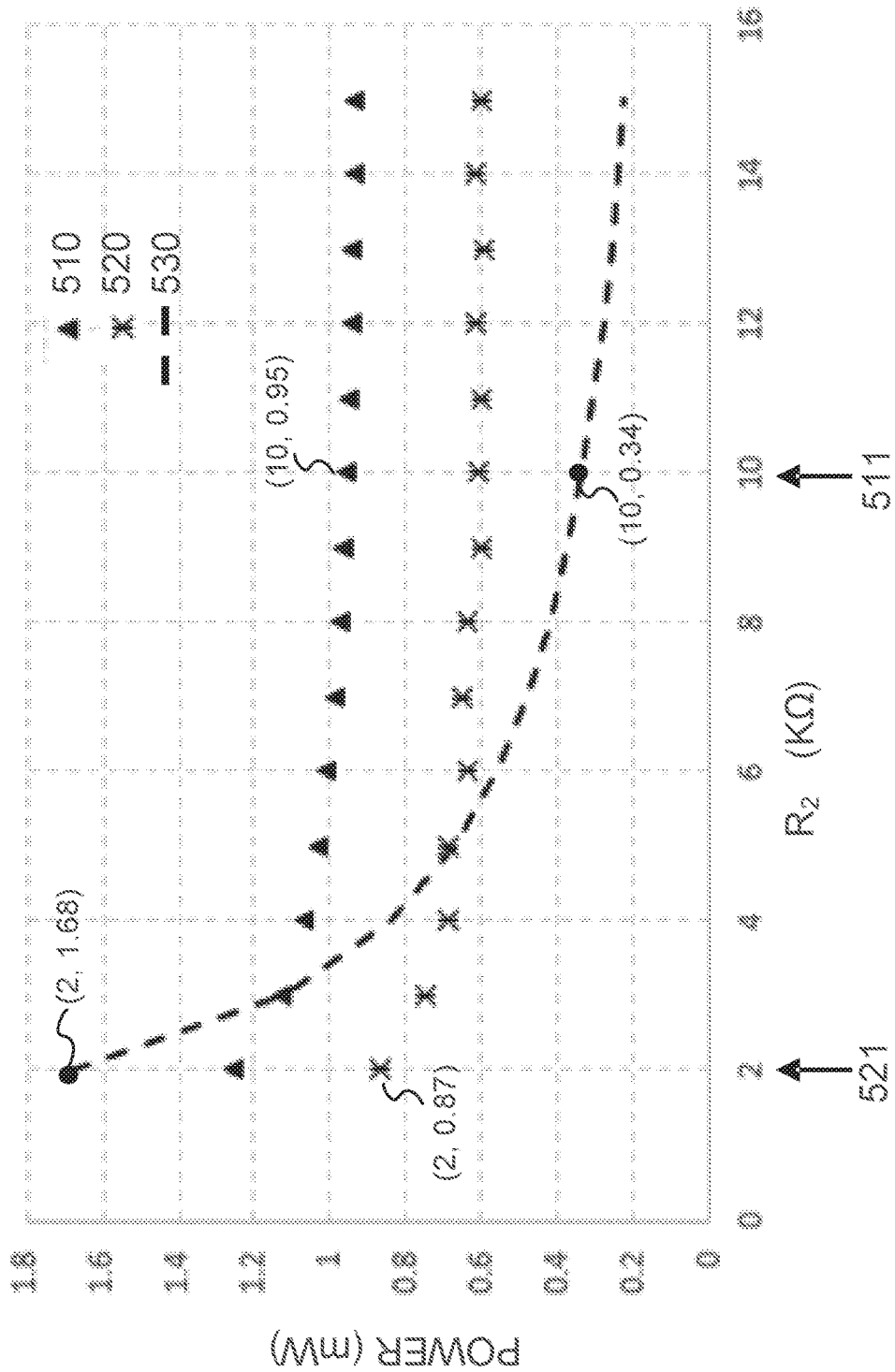
FIG. 5 illustrates aspects of a high-sensitivity memory interface receiver according to various embodiments described herein.

FIGS. 4-5 assume that the value of resistors 310 and 316 are equal, that the resistance value $R_F$ of resistor 360 is approximately 20 kOhms, and that the transconductance $g_{m2}$ of FETs 340 and 345 is twice the value of the transconductance of FETs 330, 335, 342, and 347. FIG. 4 shows a graph of different resistance values $R_2$ of resistor 310 whose value is same as the value $R_1$ of resistor 316 Data 410 shows simulated values for circuit 300 above, and data 420 shows simulated values for the related circuit described above. Illustrated values selected for operating points 410A and 420A to achieve a receiver gain of 2.2 are also shown.

FIG. 5 then shows power consumption as resistance values $R_2$ of resistor 310 change. Data 510 shows power consumption of the receiver block of FIG. 3. Data 520 shows power consumption for the related design. Data 530 shows power consumption of the reference voltage VREF based on a basic voltage splitter with a drive strength ration of 20 chosen so that the VREF value does not drift when loaded. Power consumption of the VREF block thus increases significantly when the value of $R_2$ is lowered. Point 511 shows the graph point for 10 kOhms selected as illustrated in FIG. 4 for circuit 300. Point 521 similarly shows the 2 kOhm value selected for the related circuit as illustrated in FIG. 4. Power consumption can be seen to be lower for circuit 300 based on FIG. 5. The circuits include both receiver (e.g. 510 or 520 for respective circuits) and Vref power consumption (e.g. the dotted line 530 of FIG. 5). The total power consumption (e.g. power consumption of the receiver in addition to the power consumption of the reference generator (VREF) can be seen to be lower for circuit 300 based on FIG. 5.

Figure 6:
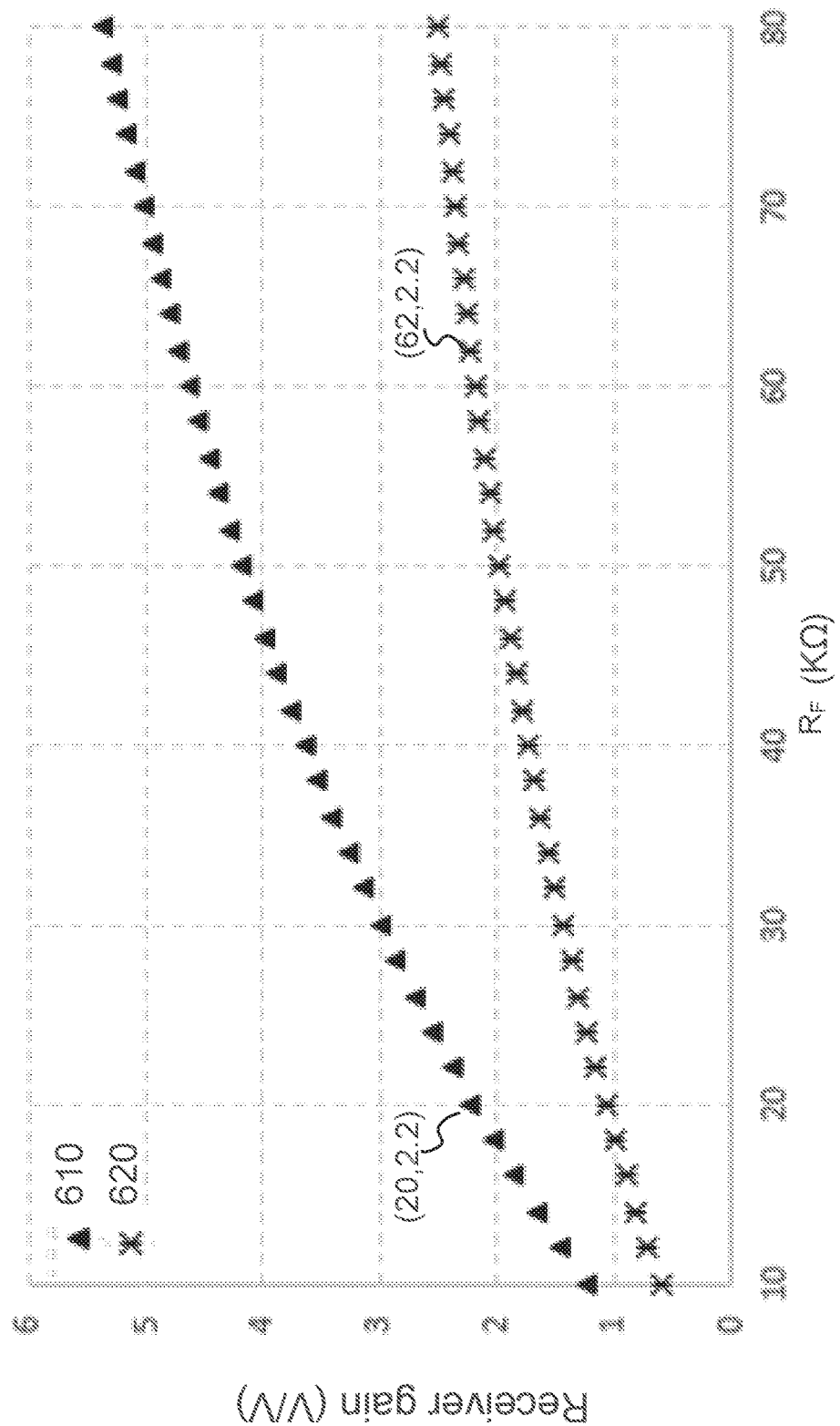
FIG. 6 illustrates aspects of a high-sensitivity memory interface receiver according to various embodiments described herein.
Figure 7:
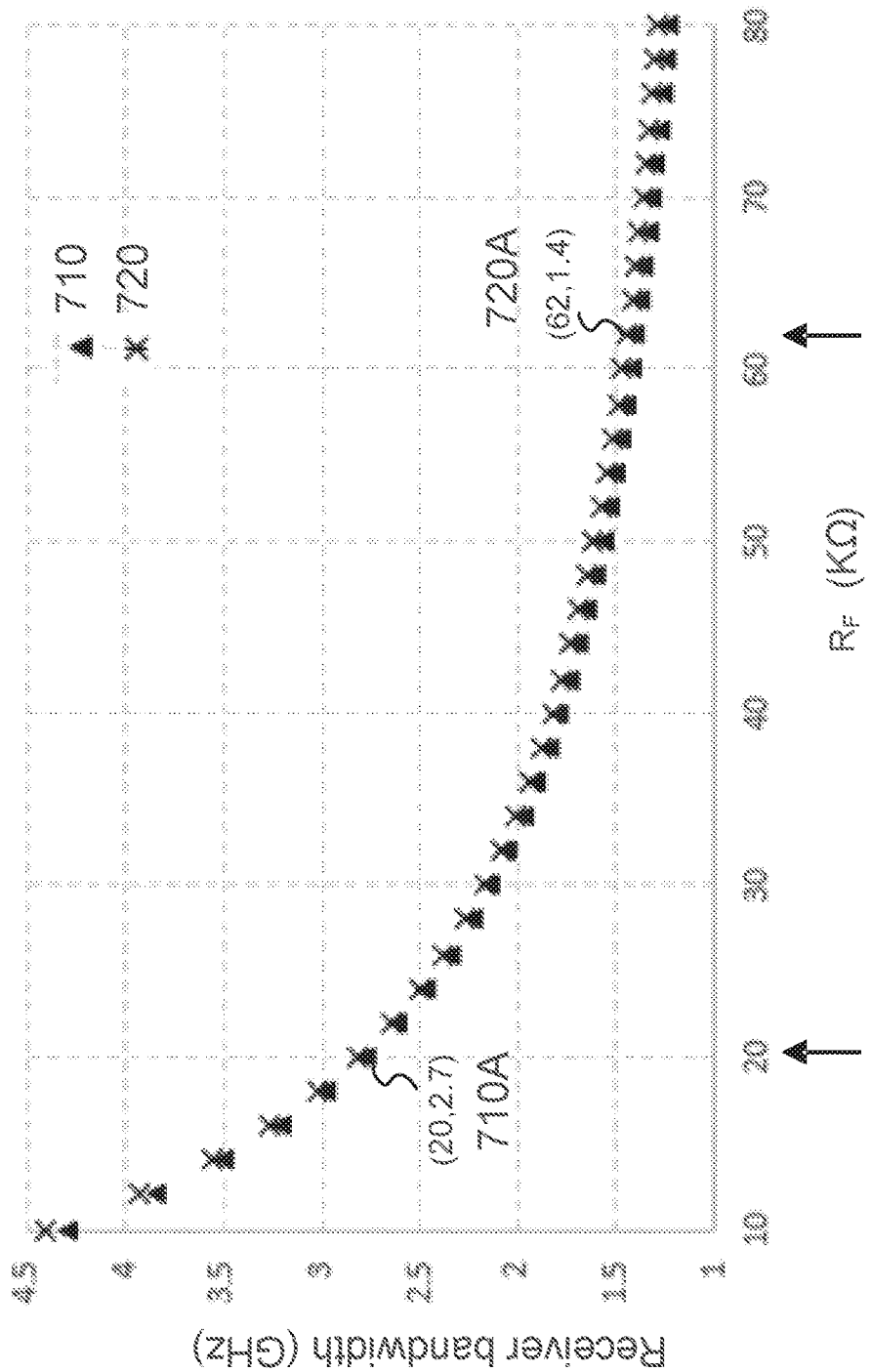
FIG. 7 illustrates aspects of a high-sensitivity memory interface receiver according to various embodiments described herein.

FIGS. 6-7 then assume that the resistances of resistors 310 and 316 are 10 kOhms as selected above in the analysis associated with FIGS. 4-5. Data 610 shows a chart of the resistance $R_F$ of resistor 360 charted against the receiver gain, with the operating point at 20 kOhms that was assumed in FIGS. 4-5 called-out. Data 620 similarly shows the gain vs. $R_F$ value for the related circuit described above, where $R_F$ is at approximately 62 kOhms to achieve the receiver gain of 2.2.

FIG. 7 then shows a chart of $R_F$ against the receiver bandwidth. Data 710 shows the graph for circuit 300, and data 720 shows a graph for the related receiver circuit. Operating data point 710A shows that the bandwidth for circuit 300 is significantly higher than the bandwidth for the related circuit shown by operating data point 720A.

Figure 8:
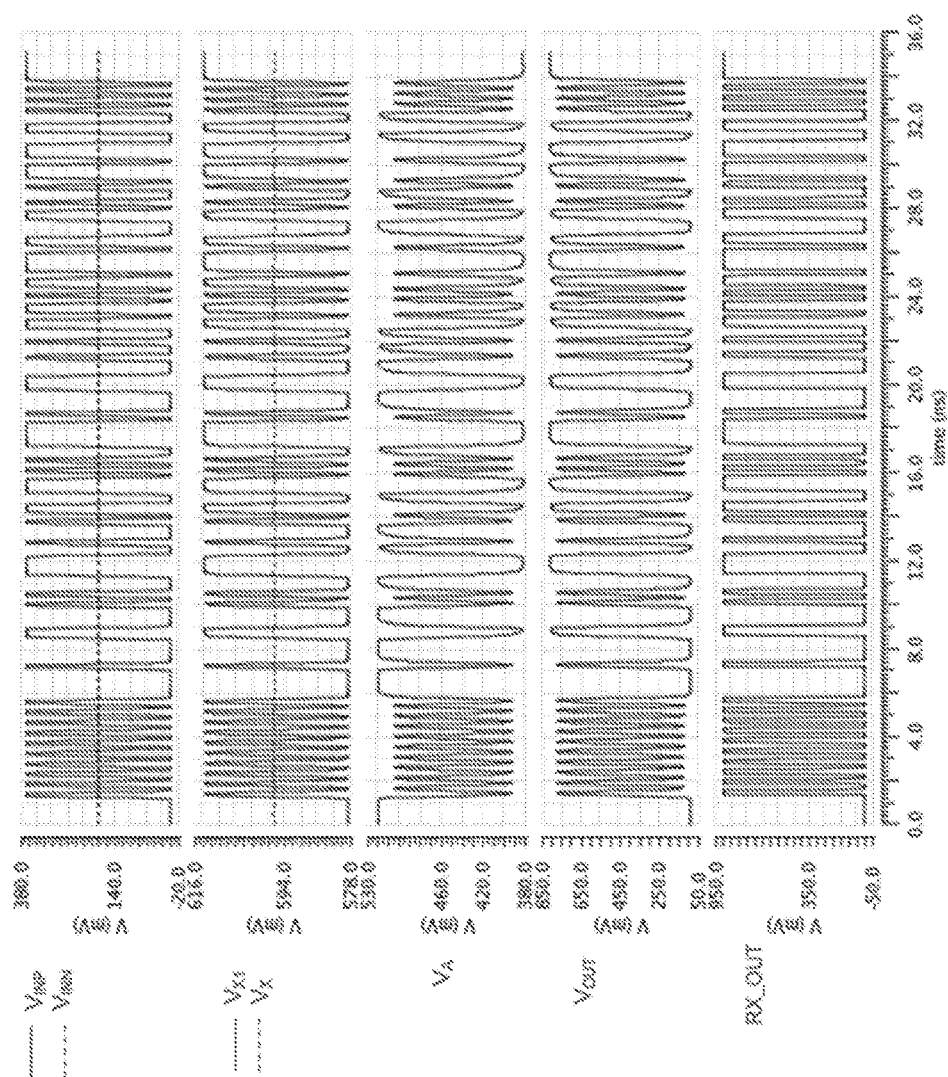
FIG. 8 illustrates additional aspects of a high-sensitivity memory interface receiver according to various embodiments described herein.
Figure 9:
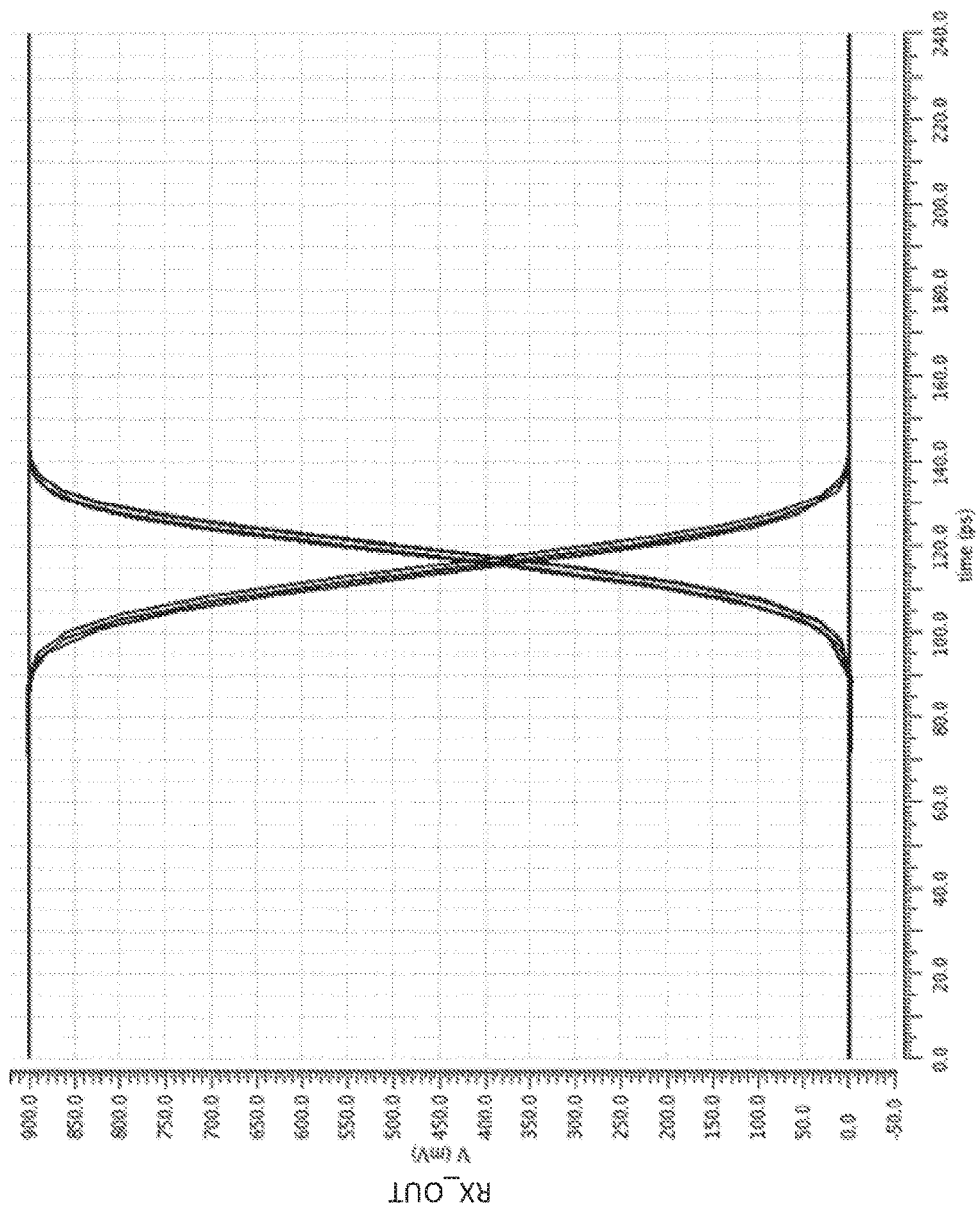
FIG. 9 illustrates additional aspects of a high-sensitivity memory interface receiver according to various embodiments described herein.

FIGS. 8 and 9 then illustrate additional aspects of a high-sensitivity memory interface receiver according to various embodiments described herein. FIG. 8 shows simulated results of the receiver architecture of FIGS. 3A-C operating at 4266 megabits per second according to low power double data rate 4 (LPDDR4) protocols in 28 nanometer technology with the circuit parameters above with $R_1=R_2=10$ KΩ (e.g., the values of resistors 310 and 316), $R_F=20$ KΩ (e.g., the value of resistor 360), and $g_{m2}=2*g_{m1}$ (e.g., the transconductance of FETs 345 and 340 is twice the transconductance of FETs 330, 335, 342, and 347).

In the simulation of FIG. 8, $V_{INP}$ (e.g., the voltage of node RX+ input to resistor 316) swings from 0 V to 0.33*VDDQ with $V_{INN}=0.166$*VDDQ (e.g., where $V_{INN}$ is the voltage at RX− input to resistor 310). The voltage $V_{X1}$ is the voltage at node 304 at the drain terminal of NMOS FET 335. VDDQ is the I/O supply voltage whose nominal value is 1.1 V. The modeled core supply nominal voltage is 0.9V. While FIG. 8 illustrates one implementation, other implementations and circuit design values are possible within the scope of the described embodiments. FIG. 9 shows an eye diagram of the modeled receiver output (e.g., RX_OUT) data from FIG. 8 using the design values for the system of FIGS. 3A-C detailed in FIGS. 4-7.

Figure 10:
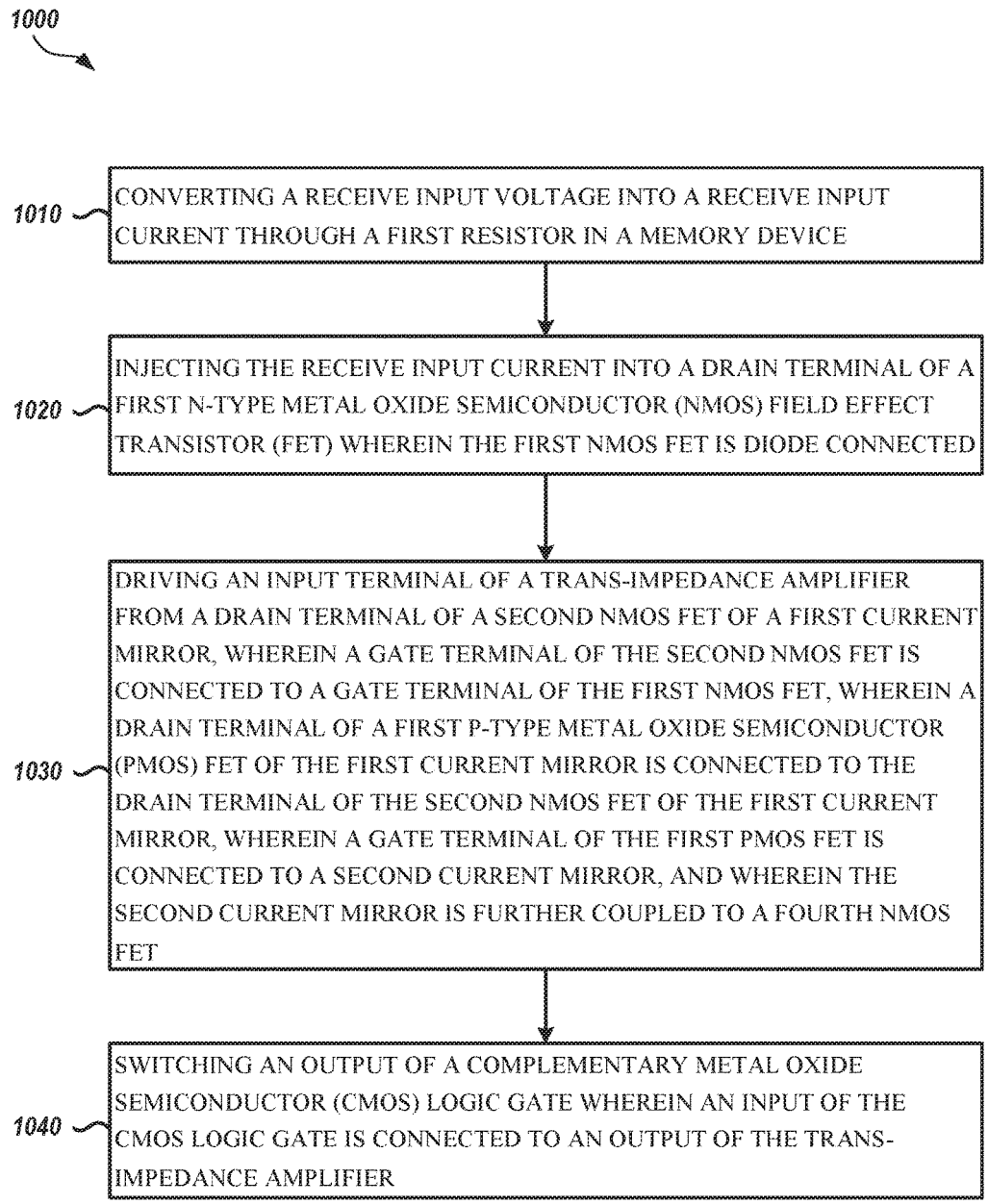
FIG. 10 illustrates an example operational flow of a receiver apparatus, in accordance with some embodiments.

FIG. 10 shows method 1000, which may be performed by a device, in accordance with some embodiments. In other embodiments, method 1000 is simulated by a circuit design within an EDA computing system as part of design verification or other circuit design operations. In such embodiments, circuit design files or other EDA files may comprise instructions that, when executed by one or more processors, cause the EDA device to perform or simulate method 400.

The example embodiment of method 1000 begins with operation 1010 converting a receive input voltage into a receive input current through a first resistor. Operation 1020 then involves injecting the receive input current into a drain terminal of a first NMOS FET wherein the first NMOS FET is diode connected. An input terminal of a trans-impedance amplifier is driven from a drain terminal of a second NMOS FET in operation 1030. As described in various embodiments, in the particular circuit 300 above, a gate terminal of the second NMOS FET is connected to a gate terminal of the first NMOS FET. Further, a drain terminal of a first PMOS FET of the first current mirror is connected to the drain terminal of the second NMOS FET of the first current mirror, a gate terminal of the first PMOS FET is connected to a second current mirror, and wherein the second current mirror is further coupled to a fourth NMOS FET as illustrated in FIG. 3A.

An output of a CMOS logic gate (e.g., circuit 372 and/or 374) is switched in operation 1040, wherein an input of the CMOS logic gate is connected to an output of the trans-impedance amplifier.

In various embodiments, additional operations may be performed as part of further embodiments. For example, some embodiments additionally involve shielding the first NMOS FET and the fourth NMOS FET from I/O voltage levels using the resistor wherein the first NMOS FET and the fourth NMOS FET are low voltage devices. Some embodiments involve sourcing a first bias current into the drain terminal of the first NMOS FET such that the first NMOS FET remains active when the receive first input voltage is low. Some such embodiments further involve sourcing a second bias current into the drain terminal of the fourth NMOS FET such that the fourth NMOS FET remains active when the receive second input voltage is low. Further third and fourth current sources are controlled at the input to a trans-impedance amplifier stage such that the output of the CMOS logic gate switches when the receive input voltage transitions through a decision threshold voltage (e.g., VREF). Other further embodiments involve such calibration operations as described above performed prior to operation 1010. In various embodiments, control circuitry or machine-readable instructions executed by a processor perform the calibrations and determine calibration offsets. The calibration offsets are then fixed and used during operations 1010 through 1040.

These operations may be performed by various devices described herein, as well as any other suitable structured device. In some embodiments, the above methods are simulated by EDA systems operating on an EDA computing device to model and test a circuit design.

In some embodiments, such an apparatus is structured where the first NMOS FET and the fourth NMOS FET are low voltage devices and wherein the first and fourth resistor is configured to shield the first NMOS FET and the fourth NMOS FET respectively from I/O voltage levels. Further embodiments may include a first current source connected to the drain terminal of the first NMOS FET and a second current source connected to the drain terminal of the fourth NMOS FET. Some additional embodiments are structured where the first current source is configured to maintain the first NMOS transistor in active mode when the first receiver input is low. Still further such embodiments are structured where the second current source is also configured to maintain a selected voltage at the drain terminal of the fourth NMOS transistor.

Additionally, some embodiments include a first switch connected between the second terminal of the first resistor and the drain terminal of the first NMOS FET; a second resistor wherein a first terminal of the second resistor is connected to a voltage reference (VREF) terminal that is configured to indicate a common mode of the first receiver input; and a second switch wherein a first terminal of the second switch is connected to a second terminal of the second resistor and a second terminal of the second switch is connected to the drain terminal of the first NMOS FET. Some such embodiments also include control circuitry configured to calibrate a decision threshold of the first receiver input to be the common mode. Other such embodiments have the first switch and the second switch implemented with CMOS transmission gates comprising I/O FETs.

Still further such embodiments include a third resistor wherein a first terminal of the third resistor is connected to a VREF terminal that is configured to indicate a common mode of the second receiver input; a third switch wherein a first terminal of the third switch is connected to a second terminal of the third resistor and a second terminal of the third switch is connected to the drain terminal of the fourth NMOS FET; a fourth resistor wherein a first terminal of the fourth resistor is connected to a second receiver input of the receiver apparatus; and a fourth switch wherein a first terminal of the fourth switch is connected to a second terminal of the fourth resistor and a second terminal of the fourth switch is connected to the drain terminal of the fourth NMOS FET. In some such embodiments, the first receiver input and the second receiver input are configured to receive a differential signal.

Some embodiments also are structured where the trans-impedance amplifier comprises: a PMOS FET configured to source current to the output terminal of the trans-impedance amplifier wherein a gate terminal of the PMOS FET is connected to the input terminal of the trans-impedance amplifier; a third NMOS FET configured to sink current from the output terminal of the trans-impedance amplifier; and a resistor connected in a feedback configuration between the input terminal of the trans-impedance amplifier and the output terminal of the trans-impedance amplifier. Some such embodiments are further structured where the trans-impedance amplifier is configured to operate from a core supply voltage that is less than an I/O supply voltage.

In some embodiments, an offset to the trans-impedance amplifier is calibrated by the following operations. A calibration mode is set using an input reference voltage (e.g., VREF). A pull-up current source at the input of the trans-impedance amplifier is set to an off state and a pull-down current source at the input of the trans-impedance amplifier is set to an on state, with a pull-down current set to a maximum pull-down current. The calibration then proceeds with incrementally decreasing the pull-down current at the input of the trans-impedance amplifier until the receive output voltage transitions through a decision threshold voltage. In some embodiments, the decision threshold voltage is half of signal supply voltage. The pull-down current at the point when the receive output voltage toggles (e.g. changes from one extreme to another or transitions through a decision threshold) is selected as a calibration offset setting for use during circuit operation.

If, while incrementally decreasing the pull-down current at the input of the trans-impedance amplifier, the pull-down current reaches a minimum value without the receive output voltage transitioning through a decision threshold voltage, then in response to the pull-down current reaching the minimum value, the calibration proceeds by setting the pull-up current source at the input of the trans-impedance amplifier to an on state with a minimum pull-up current, and setting the pull-down current source at the input of the trans-impedance amplifier to an off state. The pull-up current at the input of the trans-impedance amplifier is incrementally increased until the receive output voltage transitions through a decision threshold voltage. The pull-up current at the point when the receive output voltage transitions through the decision threshold voltage is selected as a calibration offset setting for use during circuit operation.

In various embodiments, aspects of the circuitry are implemented differently, including structures with a digital signal processor, a programmable logic device, a field programmable gate array, a microprocessor, a microcontroller, or a digital application specific integrated circuit (ASIC).

Any apparatus described herein may be modeled and simulated using EDA tools. Some embodiments, then, rather than being physical circuits, are non-transitory computer-readable media comprising instructions that, when executed by one or more processors of a computing device, cause the computing device to generate a circuit design by configuring the computing device to perform operations comprising configuring circuit elements within a model circuit design file as part of a circuit design. Such circuit design files are further used to model operations in accordance with some embodiments.

Additionally, it will be apparent that any apparatus or operations described herein in accordance with various embodiments may be structured with intervening, repeated, or other elements while still remaining within the scope of the contemplated embodiments. Some embodiments may include multiple receivers, along with any other circuit elements. Some embodiments may function with described operating modes as well as other operating modes. The various embodiments described herein are thus presented as examples, and do not exhaustively describe every possible implementation in accordance with the possible embodiments.

Figure 11:
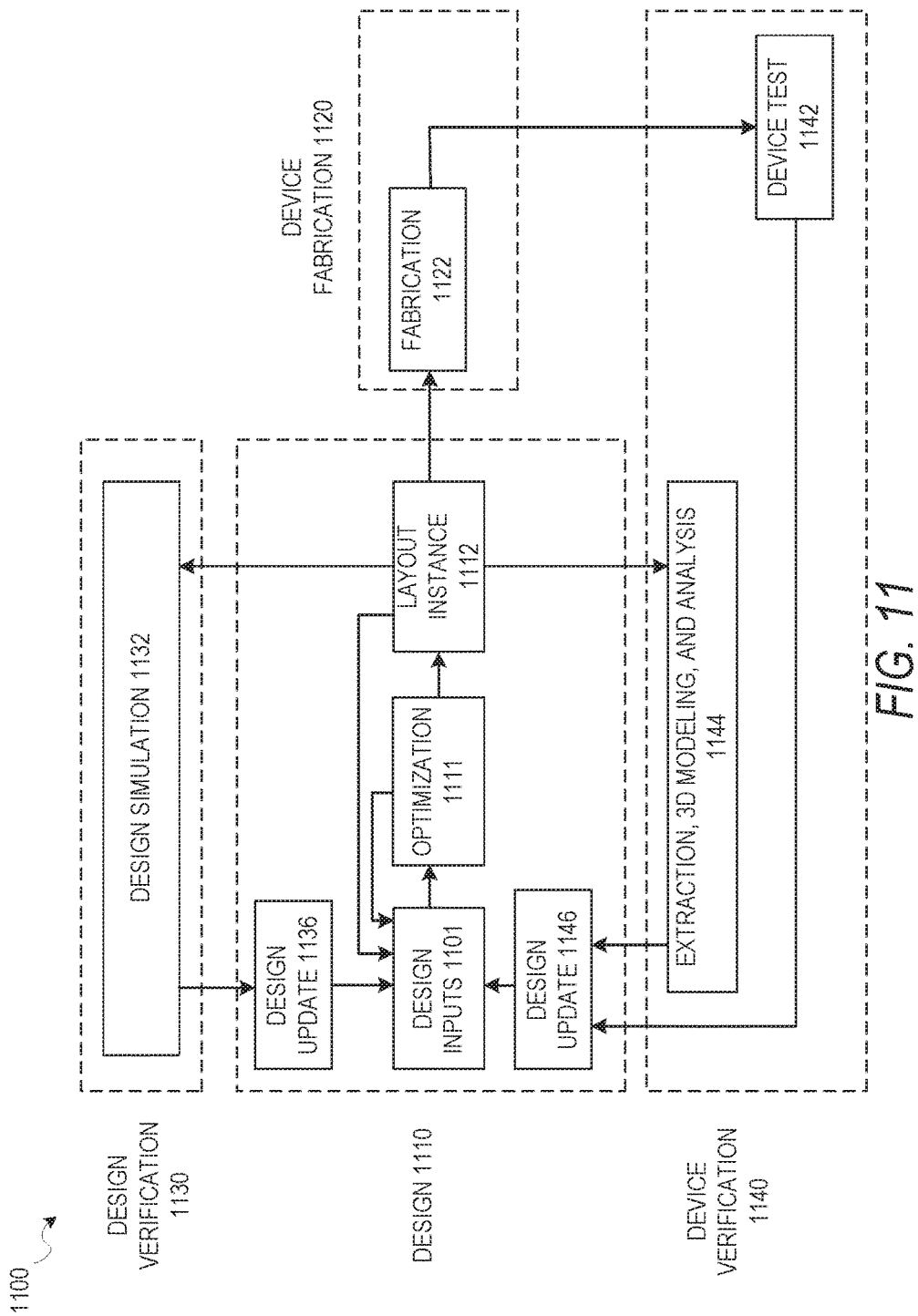
FIG. 11 is a diagram illustrating one possible design process flow for generating a circuit including embodiments to implement receiver circuits to interface a microprocessor with memory, in accordance with some embodiments.

FIG. 11 is a diagram illustrating one possible design process flow for generating a circuit including embodiments to implement receiver circuits to interface a microprocessor, e.g., microprocessor 110, with memory, in accordance with some embodiments. As illustrated, the overall design flow 1100 includes a design phase 1110, a device fabrication phase 1120, a design verification phase 1130, and a device verification phase 1140. The design phase 1110 involves an initial design input operation 1101 where the basic elements and functionality of a device are determined, as well as revisions made based on various analyses and optimization of a circuit design. This design input operation 1101 is where instances of a design block are used in the design and any additional circuitry is selected. The initial strategy, tactics, and context for the device to be created are also generated in the design input operation 1101, depending on the particular design algorithm to be used.

In some embodiments, following an initial selection of design values in design input operation 1101, timing analysis and optimization, according to various embodiments, occurs in an optimization operation 1111, along with any other automated design processes. One such process may be the automated design of control circuitry to switch a DDR programmable level translator device depending on the type of DDR memory being accessed. As described below, design constraints for blocks of a circuit design generated with design inputs in design input operation 1101 may be analyzed using hierarchical timing analysis according to various embodiments. While design flow 1100 shows such optimization occurring prior to layout instance 1112, such hierarchical timing analysis and optimization may be performed at any time to verify operation of a circuit design. For example, in various embodiments, constraints for blocks in a circuit design may be generated prior to routing of connections in a circuit design, after routing, during register transfer level (RTL) operations, or as part of a final signoff optimization or verification prior to a device fabrication operation 1122.

After design inputs are used in design input operation 1101 to generate a circuit layout, and any optimization operations 1111 are performed, a layout is generated in layout instance 1112. The layout describes the physical layout dimensions of the device that match the design inputs. This layout may then be used in a fabrication operation 1122 to generate a device, or additional testing and design updates may be performed using designer inputs or automated updates based on the design simulation 1132 operations or three-dimensional structure modeling and analysis 1144 operations. Once the device is generated, the device can be tested as part of device test 1142 operations, and layout modifications generated based on actual device performance.

As described in more detail below, design updates 1136 from design simulation 1132, design updates 1146 from device test 1142 or 3D structure modeling and analysis 1144 operations, or direct design input operation 1101 may occur after an initial layout instance 1112 is generated. In various embodiments, whenever design inputs are used to update or change an aspect of a circuit design, a timing analysis and optimization operation 1111 may be performed.

For example, in various embodiments, a user may provide an input to an EDA computing device indicating placement of an instance of a design block within a first portion of a circuit design. Once a design is ready, another input to the EDA computing device may be used to generate constraints for each instance of the design block, and a timing analysis may be performed using the constraints. An output to a display of the EDA computing device may show results of the timing analysis, or may show optimizations recommended or automatically perform adjustments to the circuit design based on the timing analysis. Further inputs to the EDA computing device may involve adjustments as user design inputs, with additional timing analysis and optimization initiated via user operation of the EDA computing device.

Figure 12:
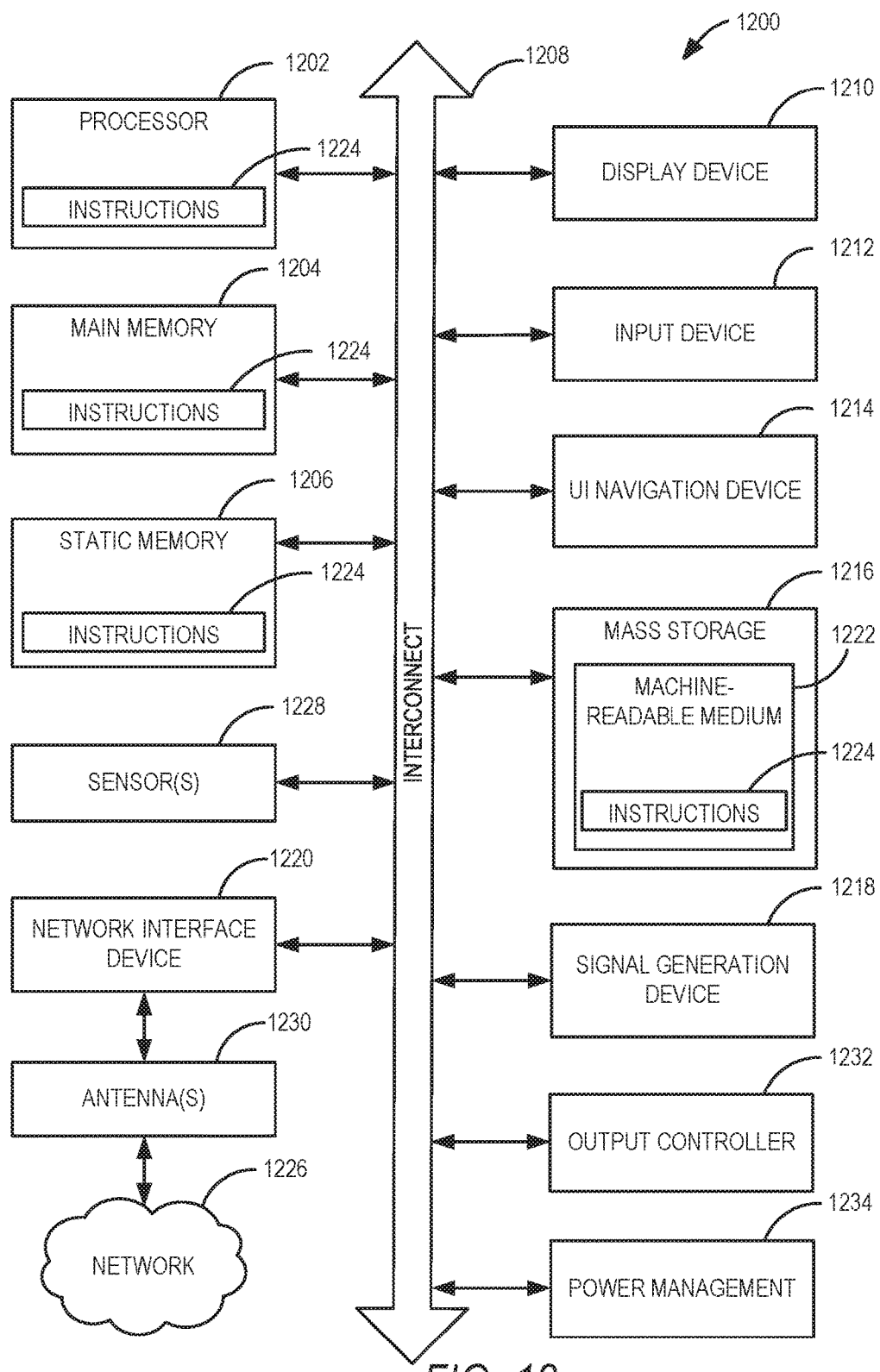
FIG. 12 is a block diagram illustrating an example computer system machine upon which any one or more of the methodologies herein discussed can be run.

FIG. 12 is a block diagram illustrating an example computer system machine 1200 upon which any one or more of the methodologies herein discussed can be run. Computer system machine 1200 or elements of computer system machine 1200 may be used to implement any device, a mobile phone, tablet, laptop wireless access point, wireless station device, or any other such device described herein. In various other embodiments, different device components or multiples of any element may be used in different devices. Some embodiments may involve the use of a computer system machine 1200 running electronic design automation tools to aid in the design and creation of hardware systems. In various alternative embodiments, the machine 1200 operates as a standalone device or can be connected (e.g., networked) to other machines. In a networked deployment, the machine 1200 can operate in the capacity of either a server or a client machine in server-client network environments, or it can act as a peer machine in peer-to-peer (or distributed) network environments. The machine 1200 can be a personal computer (PC) that may or may not be portable (e.g., a notebook or a netbook), a tablet, a set-top box (STB), a gaming console, a personal digital assistant (PDA), a mobile telephone or smartphone, a web appliance, a network router, switch or bridge, or any machine capable of executing instructions (sequential or otherwise) that specify actions to be taken by that machine. Further, while only a single machine 1200 is illustrated, the term "machine" shall also be taken to include any collection of machines that individually or jointly execute a set (or multiple sets) of instructions to perform any one or more of the methodologies discussed herein.

Example computer system machine 1200 includes a processor 1202 (e.g., a central processing unit (CPU), a graphics processing unit (GPU) or both), a main memory 1204 and a static memory 1206, which communicate with each other via an interconnect 1208 (e.g., a link, a bus, etc.). The computer system machine 1200 can further include a display device 1210, an alphanumeric input device 1212 (e.g., a keyboard), and a user interface (UI) navigation device 1214 (e.g., a mouse). In one embodiment, the display device 1210, input device 1212, and UI navigation device 1214 are a touch screen display. The computer system machine 1200 can additionally include a storage device 1216 (e.g., a drive unit), a signal generation device 1218 (e.g., a speaker), an output controller 1232, a power management controller 1234, and a network interface device 1220 (which can include or operably communicate with one or more antennas 1230, transceivers, or other wireless communications hardware), and one or more sensors 1228, such as a Global Positioning Sensor (GPS) sensor, compass, location sensor, accelerometer, or other sensor.

The storage device 1216 includes a machine-readable medium 1222 on which is stored one or more sets of data structures and instructions 1224 (e.g., software) embodying or utilized by any one or more of the methodologies or functions described herein. The instructions 1224 can also reside, completely or at least partially, within the main memory 1204, static memory 1206, and/or within the processor 1202 during execution thereof by the computer system machine 1200, with the main memory 1204, static memory 1206, and the processor 1202 also constituting machine-readable media 1222.

While the machine-readable medium 1222 is illustrated in an example embodiment to be a single medium, the term "machine-readable medium" can include a single medium or multiple media (e.g., a centralized or distributed database, and/or associated caches and servers) that store the one or more instructions 1224. The term "machine-readable medium" shall also be taken to include any tangible medium that is capable of storing, encoding or carrying instructions 1224 for execution by the machine 1200 and that cause the machine 1200 to perform any one or more of the methodologies of the present disclosure or that is capable of storing, encoding or carrying data structures utilized by or associated with such instructions 1224.

Various techniques, or certain aspects or portions thereof may take the form of program code (e.g., instructions 1224)

embodied in tangible media, such as floppy diskettes, CD-ROMs, hard drives, non-transitory computer-readable storage medium, or any other machine-readable storage medium wherein, when the program code is loaded into and executed by a machine, such as a computer, the machine becomes an apparatus for practicing the various techniques. In the case of program code execution on programmable computers, the computing device may include a processor 1202, a storage medium readable by the processor 1202 (including volatile and non-volatile memory and/or storage elements), at least one input device 1212, and at least one output device. The volatile and non-volatile memory and/or storage elements may be a RAM, erasable programmable read only memory (EPROM), flash drive, optical drive, magnetic hard drive, or other medium for storing electronic data. One or more programs that may implement or utilize the various techniques described herein may use an application programming interface (API), reusable controls, and the like. Such programs may be implemented in a high-level procedural or object-oriented programming language to communicate with a computer system. However, the program(s) may be implemented in assembly or machine language, if desired. In any case, the language may be a compiled or interpreted language, and combined with hardware implementations.

The embodiments described above can be implemented in one or a combination of hardware, firmware, and software. Various methods or techniques, or certain aspects or portions thereof, can take the form of program code (e.g., instructions 1224) embodied in tangible media, such as flash memory, hard drives, portable storage devices, read-only memory (ROM), RAM, semiconductor memory devices (e.g., EPROM, electrically erasable programmable read-only memory (EEPROM)), magnetic disk storage media, optical storage media, and any other machine-readable storage medium 1222 or storage device 1216 wherein, when the program code is loaded into and executed by a machine 1200, such as a computer or networking device, the machine 1200 becomes an apparatus for practicing the various techniques.

A machine-readable storage medium 1222 or other storage device 1216 can include any non-transitory mechanism for storing information in a form readable by a machine 1200 (e.g., a computer). In the case of program code executing on programmable computers, the computing device can include a processor 1202, a storage medium 1222 readable by the processor 1202 (including volatile and non-volatile memory and/or storage elements), at least one input device 1212, and at least one output device. One or more programs that can implement or utilize the various techniques described herein can use an API, reusable controls, and the like. Such programs can be implemented in a high-level procedural or object-oriented programming language to communicate with a computer system. However, the program(s) can be implemented in assembly or machine language, if desired. In any case, the language can be a compiled or interpreted language, and combined with hardware implementations.

It should be understood that the functional units or capabilities described in this specification can have been referred to or labeled as components or modules, in order to more particularly emphasize their implementation independence. For example, a component or module can be implemented as a hardware circuit comprising custom very-large-scale integration (VLSI) circuits or gate arrays, off-the-shelf semiconductors such as logic chips, transistors, or other discrete components. A component or module can also be implemented in programmable hardware devices such as field programmable gate arrays, programmable array logic, programmable logic devices, or the like. Components or modules can also be implemented in software for execution by various types of processors. An identified component or module of executable code can, for instance, comprise one or more physical or logical blocks of computer instructions 1224, which can, for instance, be organized as an object, procedure, or function. Nevertheless, the executables of an identified component or module need not be physically located together, but can comprise disparate instructions 1224 stored in different locations which, when joined logically together, comprise the component or module and achieve the stated purpose for the component or module.

Indeed, a component or module of executable code can be a single instruction, or many instructions 1224, and can even be distributed over several different code segments, among different programs, and across several memory devices. Similarly, operational data can be identified and illustrated herein within components or modules, and can be embodied in any suitable form and organized within any suitable type of data structure. The operational data can be collected as a single data set, or can be distributed over different locations including over different storage devices 1216, and can exist, at least partially, merely as electronic signals on a system or network. The components or modules can be passive or active, including agents operable to perform desired functions.

We claim that:
1. A receiver apparatus for receiving data from a memory device, the apparatus comprising:
   a first resistor wherein a first terminal of the first resistor is connected to a first receiver input of the receiver apparatus;
   a first N-type metal oxide semiconductor (NMOS) field effect transistor (FET) wherein a drain terminal of the first NMOS FET is connected to a second terminal of the first resistor and a gate terminal of the first NMOS FET is connected to the drain terminal of the first NMOS FET;
   a second NMOS FET wherein a gate terminal of the second NMOS FET is connected to the gate terminal of the first NMOS FET;
   a first P-type metal oxide semiconductor (PMOS) FET, wherein a drain terminal of the first PMOS FET is connected to a drain terminal of the second NMOS FET, and wherein a source terminal of the first PMOS FET is connected to a first voltage supply;
   a second PMOS FET, wherein a source terminal of the second PMOS FET is connected to the first voltage supply, wherein a gate terminal of the second PMOS FET is connected to a drain terminal of the second PMOS FET, wherein the gate terminal of the second PMOS FET is further connected to the gate terminal of the first PMOS FET;
   a third NMOS FET wherein a drain terminal of the third NMOS FET is connected to the drain terminal of the second PMOS FET;
   a fourth NMOS FET wherein a gate terminal of the fourth NMOS FET is connected to a gate terminal of the third NMOS FET and where the gate terminal of the fourth NMOS FET is connected to a drain terminal of the fourth NMOS FET; and
   a trans-impedance amplifier wherein an input terminal of the trans-impedance amplifier is connected to the drain terminal of the second NMOS FET.

2. The receiver apparatus of claim 1, further comprising:
a complementary metal oxide semiconductor (CMOS) logic gate wherein an input terminal of the CMOS logic gate is connected to a data output terminal of the receiver apparatus.

3. The receiver apparatus of claim 1, wherein the first, second, third, and fourth NMOS FETs and the first and second PMOS FETs are low voltage devices; and
wherein the first resistor and the fourth resistor is configured to shield the first and fourth NMOS FET respectively from input/output (I/O) voltage levels.

4. The receiver apparatus of claim 2, further comprising:
a first current source connected to the drain terminal of the first NMOS FET; and
a second current source connected to the drain terminal of the fourth NMOS FET.

5. The receiver apparatus of claim 4, wherein the first current source is configured to maintain the first NMOS FET in active mode when the first receiver input is low.

6. The receiver apparatus of claim 5, wherein the second current source is configured to maintain the fourth NMOS FET in active mode when the second receiver input is low.

7. The receiver apparatus of claim 6, further comprising:
a first switch connected between the second terminal of the first resistor and the drain terminal of the first NMOS FET:
a second resistor wherein a first terminal of the second resistor is connected to a voltage reference (VREF) terminal that is configured to indicate a common mode of the first receiver input; and
a second switch wherein a first terminal of the second switch is connected to a second terminal of the second resistor and a second terminal of the second switch is connected to the drain terminal of the first NMOS FET.

8. The receiver apparatus of claim 7, further comprising:
a third resistor wherein a first terminal of the third resistor is connected to the voltage reference (VREF) terminal that is configured to indicate the common mode of the second receiver input;
a third switch wherein a first terminal of the third switch is connected to a second terminal of the third resistor and a second terminal of the third switch is connected to the drain terminal of the fourth NMOS FET;
a fourth resistor wherein a first terminal of the fourth resistor is connected to a second receiver input of the receiver apparatus; and
a fourth switch wherein a first terminal of the fourth switch is connected to a second terminal of the fourth resistor and a second terminal of the fourth switch is connected to the drain terminal of the fourth NMOS FET;
wherein each of the first, second, third, and fourth switches are configurable for an open position and a closed position.

9. The receiver apparatus of claim 8 wherein the second and third switches are configured for the closed position and the first and fourth switches are configured for the open position during calibration operations.

10. The receiver apparatus of claim 9 wherein the second and third switches are configured for the open position and the first and fourth switches are configured for the closed position during single ended and differential signal operation mode;
wherein the first terminal of the fourth resistor is connected to reference voltage VREF in case of single ended operation mode.

11. The receiver apparatus of claim 10, further comprising:
a third current source coupled from the drain terminal of the second NMOS FET to a second ground node.

12. The receiver apparatus of claim 11, further comprising control circuitry configured to perform a first calibration by: adjusting a current of the third current source from a maximum first calibration current value towards a minimum first calibration current value; and determining a first calibration current value for the current of the third current source where the data output terminal toggles from high to low.

13. The receiver apparatus of claim 12, further comprising a fourth current source coupled from a first voltage supply to the drain terminal of the second NMOS FET;
wherein the control circuitry is further configured to:
adjust a current of the fourth current source from a minimum second calibration current value toward a maximum second calibration current value when the current of the third current source reaches the minimum first calibration current value without the data output terminal toggling from high to low such that the first calibration current value is the minimum first calibration current value; and
determining a second calibration current value based on the current of the fourth current source when the data output terminal toggles from high to low.

14. The receiver apparatus of claim 1, further comprising any one or more of a digital signal processor, a programmable logic device, a field programmable gate array, a microprocessor, a microcontroller or a digital application specific integrated circuit (ASIC).

15. A method comprising:
converting a receive input voltage into a receive input current through a first resistor in a memory device operating on an input/output (I/O) power supply voltage that is greater than a core supply voltage;
injecting the receive input current into a drain terminal of a first N-type metal oxide semiconductor (NMOS) field effect transistor (FET) wherein the first NMOS FET is diode connected;
driving an input terminal of a trans-impedance amplifier from a drain terminal of a second NMOS FET of a first current mirror, wherein a gate terminal of the second NMOS FET is connected to a gate terminal of the first NMOS FET, wherein a drain terminal of a first P-Type metal oxide semiconductor (PMOS) FET of the first current mirror is connected to the drain terminal of the second NMOS FET of the first current mirror, wherein a gate terminal of the first PMOS FET is connected to a second current mirror, and wherein the second current mirror is further coupled to a fourth NMOS FET; and
switching an output of a complementary metal oxide semiconductor (CMOS) logic gate wherein an input of the CMOS logic gate is connected to an output of the trans-impedance amplifier.

16. The method of claim 15, further comprising:
shielding the first NMOS FET and the fourth NMOS FET from I/O voltage levels using the first and fourth resistor respectively, wherein the first NMOS FET and the fourth NMOS FET are low voltage devices;
sourcing a first bias current into the drain terminal of the first NMOS FET such that the first NMOS FET remains active when the first receive input voltage is low; and sourcing a second bias current into the drain terminal of the fourth NMOS FET such that the fourth NMOS FET remains active when the second receive input voltage is low.

17. The method of claim 16, further comprising:
setting a calibration mode using an input reference voltage;
setting a pull-up current source at an input terminal of the trans-impedance amplifier to an off state;
setting a pull-down current source at the input terminal of the trans-impedance amplifier to an on state with a pull-down current set to a maximum pull-down current;
incrementally decreasing the pull-down current at the input terminal of the trans-impedance amplifier until the receive output voltage transitions through a decision threshold voltage; and
selecting the pull-down current at the point when the receive output voltage transitions through the decision threshold voltage as a pull-down offset setting for use during circuit operation.

18. The method of claim 16, further comprising:
setting a calibration mode using an input reference voltage;
setting a pull-up current source at the input terminal of the trans-impedance amplifier to an off state;
setting a pull-down current source at the input terminal of the trans-impedance amplifier to an on state with a pull-down current set to a maximum pull-down current;
incrementally decreasing the pull-down current at the input terminal of the trans-impedance amplifier to a minimum value while the receive output voltage transitions through a decision threshold voltage;
in response to the pull-down current reaching the minimum value, setting the pull-up current source at the input terminal of the trans-impedance amplifier to an on state with a minimum pull-up current, and setting the pull-down current source at the input terminal of the trans-impedance amplifier to an off state;
incrementally increasing a pull-up current at the input terminal of the trans-impedance amplifier until the receive output voltage transitions through the decision threshold voltage; and
selecting the pull-up current at the point when the receive output voltage transitions through the decision threshold voltage as a pull-up offset setting for use during circuit operation.

19. A non-transitory computer-readable storage medium comprising instructions that, when executed by one or more processors of a computing device, cause the computing device to generate a circuit design by performing operations comprising:
configuring a first resistor wherein a first terminal of the first resistor is connected to a first receiver input of a memory receiver apparatus;
configuring a first N-type metal oxide semiconductor (NMOS) field effect transistor (FET) wherein a drain terminal of the first NMOS FET is connected to a second terminal of the first resistor and a gate terminal of the first NMOS FET is connected to the drain terminal of the first NMOS FET;
configuring a second NMOS FET wherein a gate terminal of the second NMOS FET is connected to the gate terminal of the first NMOS FET;
configuring a first P-type metal oxide semiconductor (PMOS) FET, wherein a drain terminal of the first PMOS FET is connected to a drain of the second NMOS FET, and wherein a source terminal of the first PMOS FET is connected to a first voltage supply;
configuring a second PMOS FET, wherein a source terminal of the second PMOS FET is connected to the first voltage supply, wherein a gate terminal of the second PMOS FET is connected to a drain terminal of the second PMOS FET, wherein the gate terminal of the second PMOS FET is further connected to the gate terminal of the first PMOS FET;
configuring a third NMOS FET wherein a drain terminal of the third NMOS FET is connected to the drain terminal of the second PMOS FET;
configuring a fourth NMOS FET wherein a gate terminal of the fourth NMOS FET is connected to a gate terminal of the third NMOS FET and where the gate terminal of the fourth NMOS FET is connected to a drain terminal of the fourth NMOS FET;
configuring a trans-impedance amplifier wherein an input terminal of the trans-impedance amplifier is connected to the drain terminal of the second NMOS FET; and
storing configured elements in at least a first circuit design file as part of the circuit design.

20. The non-transitory computer readable storage medium of claim 19, further comprising instructions that cause the computing device to perform operations comprising:
configuring the circuit design such that the first NMOS FET and the fourth NMOS FET are low voltage devices wherein the first and fourth resistor is configured to shield the first and fourth NMOS FET respectively from input/output (L/O) voltage levels;
configuring a first current source connected to the drain terminal of the first NMOS FET;
configuring a second current source connected to the drain terminal of the fourth NMOS FET;
configuring a fourth current source connected from the first voltage supply to the drain of the second NMOS FET;
configuring a third current source connected from the drain of the second NMOS FET to a first ground terminal;
configuring a first switch connected between the second terminal of the first resistor and the drain terminal of the first NMOS FET;
configuring a second resistor wherein a first terminal of the second resistor is connected to a voltage reference (VREF) terminal that is configured to indicate a common mode of the first receiver input;
configuring a second switch wherein a first terminal of the second switch is connected to a second terminal of the second resistor and a second terminal of the second switch is connected to the drain terminal of the first NMOS FET;
configuring a third resistor wherein a first terminal of the third resistor is connected to the VREF terminal that is configured to indicate a common mode of the second receiver input;
configuring a third switch wherein a first terminal of the third switch is connected to a second terminal of the third resistor and a second terminal of the third switch is connected to the drain terminal of the fourth NMOS FET;
configuring a fourth resistor wherein a first terminal of the fourth resistor is connected to a second receiver input of the memory receiver apparatus; and
configuring a fourth switch wherein a first terminal of the fourth switch is connected to a second terminal of the fourth resistor and a second terminal of the fourth switch is connected to the drain terminal of the fourth NMOS FET.

\* \* \* \* \*